United States Patent
Shibuya et al.

(10) Patent No.: US 7,396,595 B2
(45) Date of Patent: Jul. 8, 2008

(54) SOFT METAL AND METHOD FOR PREPARATION THEREOF, AND EXTERIOR PART OF WATCH AND METHOD FOR PREPARATION THEREOF

(75) Inventors: Yoshitsugu Shibuya, Toda (JP); Junji Satoh, Kawagoe (JP); Shizue Ito, Nishitokyo (JP)

(73) Assignee: Citizen Holdings Co., Ltd., Tokyo (JP)

( * ) Notice: Subject to any disclaimer, the term of this patent is extended or adjusted under 35 U.S.C. 154(b) by 431 days.

(21) Appl. No.: 10/489,757

(22) PCT Filed: Aug. 30, 2002

(86) PCT No.: PCT/JP02/08805

§ 371 (c)(1),
(2), (4) Date: Mar. 17, 2004

(87) PCT Pub. No.: WO03/027355

PCT Pub. Date: Apr. 3, 2003

(65) Prior Publication Data

US 2004/0231159 A1    Nov. 25, 2004

(30) Foreign Application Priority Data

Sep. 19, 2001 (JP) ............................. 2001-284212
Mar. 12, 2002 (JP) ............................. 2002-066724

(51) Int. Cl.
*B32B 15/00* (2006.01)

(52) U.S. Cl. ................... 428/660; 428/663; 428/678

(58) Field of Classification Search .................. None
See application file for complete search history.

(56) References Cited

U.S. PATENT DOCUMENTS

| 2,678,271 | A | * | 5/1954 | Ham et al. | ................... 420/429 |
| 2,696,662 | A | * | 12/1954 | Le Sech | ....................... 428/622 |
| 2,850,385 | A | * | 9/1958 | Nisbet | ........................ 420/429 |
| 3,802,939 | A | * | 4/1974 | Ohtani et al. | ................ 428/636 |
| 4,973,388 | A | * | 11/1990 | Francois et al. | ............. 205/186 |
| 5,008,149 | A | | 4/1991 | Taga et al. | |
| 5,100,486 | A | * | 3/1992 | Krikorian et al. | ........... 148/248 |
| 5,264,801 | A | * | 11/1993 | DeCou et al. | ................ 378/129 |
| 5,589,280 | A | | 12/1996 | Gibbons et al. | |
| 6,330,750 | B1 | * | 12/2001 | Meckel | ........................ 30/350 |
| 6,399,216 | B1 | * | 6/2002 | Jayaweera et al. | .......... 428/610 |

(Continued)

FOREIGN PATENT DOCUMENTS

GB    2 173 218 A    10/1986

(Continued)

*Primary Examiner*—John J Zimmerman
(74) *Attorney, Agent, or Firm*—Westerman, Hattori, Daniels & Adrian, LLP.

(57) ABSTRACT

A soft metal and a decorative article of wristwatch are produced by forming, on the surface of a soft metal article (2), a hard layer (3, 13) containing zirconium and molybdenum, or containing zirconium, molybdenum and further an additive element constituted of at least one or more elements selected from niobium, tantalum, and titanium. It is preferable that the content of molybdenum constituting the hard layer (3, 13) is about 30 to 75 wt %, or that the content of molybdenum is about 25 to 65 wt % and the total content of the additive elements is about 25 wt % or less.

10 Claims, 12 Drawing Sheets

U.S. PATENT DOCUMENTS 6,511,556 B1 * 1/2003 Van Swam .................. 148/421

FOREIGN PATENT DOCUMENTS

| | | | |
|---|---|---|---|
| JP | 48-49635 | * | 7/1973 |
| JP | 50-62137 | * | 5/1975 |
| JP | 55-006425 | * | 1/1980 |
| JP | 55-006426 | * | 1/1980 |
| JP | 58-151942 | * | 9/1983 |
| JP | 60-009869 | * | 1/1985 |
| JP | 60-50177 | | 3/1985 |
| JP | 60-137882 | | 7/1985 |
| JP | 2-115390 | | 4/1990 |
| JP | 02-133584 | * | 5/1990 |
| JP | 6-342086 | | 12/1994 |
| JP | 9-127267 | | 5/1997 |
| JP | 2001-305244 | | 10/2001 |
| JP | 2002-180217 | * | 6/2002 |

* cited by examiner (1)

(2)

SOFT METAL AND METHOD FOR PREPARATION THEREOF, AND EXTERIOR PART OF WATCH AND METHOD FOR PREPARATION THEREOF

TECHNICAL FIELD

The present invention relates to a soft metal that comprises stainless steel, iron base alloy, titanium, titanium alloy, aluminum, aluminum alloy, brass, copper, copper alloy, magnesium, magnesium alloy or the like and has high abrasion resistance, high corrosion resistance, and strength and a method of producing the same, and a decorative article of wristwatch that is strong, resistant to corrosion, and excellent in durability and provides a high-class feeling to the external appearance and a method of producing the same.

BACKGROUND TECHNOLOGY

Since soft metals including stainless steel, iron base alloy, titanium, titanium alloy, aluminum, aluminum alloy, brass, copper, copper alloy, magnesium, and magnesium alloy are light in weight and inexpensive, these metals are worked into a wide variety of components for use in various fields. Examples of a soft metal article formed by processing the soft metals include decorative articles of wristwatch, such as a wristwatch case, wristwatch bezel, wristwatch case back, wristwatch band, clasp, crown, and so forth.

Meanwhile, the soft metals are inferior in terms of abrasion resistance because the surface hardness thereof is as low as not more than Hv=200 of Vickers hardness, thereby rendering the surface thereof susceptible to scratches. Further, softer metals such as iron base alloy, except stainless steel, titanium, and titanium alloy, aluminum, aluminum alloy, brass, copper, copper alloy, magnesium, magnesium alloy and so forth, have a property susceptible to corrosion because of their poor corrosion resistance. Accordingly, with the aim of improving the abrasion resistance and corrosion resistance of the soft metals used as the constituent material of soft metal articles, attempts have so far been made to apply various surface hardening treatments for hardening the surface of the soft metal articles to the surface thereof.

As methods of hardening the surface of the soft metal, there are generally available a method of forming a film coating the surface thereof, and a method of hardening the soft metal itself.

Examples of the method of forming a film on the surface of the soft metal include processes such as wet electroplating, ion plating, and so forth. As the wet electroplating, there are in widespread use nickel electroplating, nickel-phosphorus alloy electroplating, nickel-palladium alloy electroplating and so forth, however, an electroplating film formed by any of the processes described is soft and has not reached such a condition as to eliminate the risk of scratches being caused by impacts.

On the other hand, as the ion plating, there are cited processes of forming a film such as a hard carbon film, titanium nitride film, and so froth. However, since it is difficult to directly coat the soft metal, such as aluminum, aluminum alloy, brass, copper, copper alloy and so forth, with the hard carbon film, there is the need for forming the hard carbon film with an intermediate layer made of silicon, germanium, titanium and so forth, interposed therebetween. As a result, there exist more interfaces in this case due to the presence of the intermediate layer than in the case of directly coating the soft metal, resulting in a tendency that the hard carbon film is prone to peeling to that extent. Further, the titanium nitride film has poor adhesion property against the soft metal due to its high internal stress, so that the titanium nitride film has a property to be prone to peeling. Thus, with the ion plating, there has not been completely solved a problem that, whichever film is formed, the film is prone to peeling. Furthermore, there exists another problem that once the film, which is so important, is peeled, part of the soft metal itself is exposed, so that initiation of corrosion starts from that part, thereby rendering the soft metal unfit for use in the soft metal article.

As methods of directly hardening the soft metal itself, there have been known ion implantation, ion nitriding, gas nitriding, carburizing, and so forth. However, with any of those methods, since many hours are required in application of a hardening treatment, a soft metal article cannot be efficiently produced. In addition, with the use of any of those methods, grain coarsening of the soft metal results because of high temperature needed for the hardening treatment, thereby involving the risk of occurrence of surface roughness. For example, upon application of a gas nitriding to a soft metal article after applying a mirror surface polishing thereto, there occurs surface roughness of 200 to 300 μm due to the grain coarsening of the soft metal article after the gas nitriding, thereby causing a mirror surface to disappear, whereupon it becomes impossible to restore a mirror surface condition which has existed prior to the application of the gas nitriding even if a polishing is applied thereto thereafter, so that quality will be considerably impaired in terms of decorativeness of the external appearance. Especially for decorative articles of wristwatch, in particular, for decorative articles of wristwatch such as a wristwatch case, wristwatch bezel, wristwatch case back, and so forth, the quality in terms of decorativeness of the external appearance is an important element, and therefore deterioration in the quality in terms of decorativeness of the external appearance is a serious problem.

On the other hand, there is a case where those decorative articles of wristwatch are produced of an insulating material such as resin, ceramics, or the like besides the typical soft metals, and it is needless to say that the quality in terms of decorativeness of the external appearance is important also in this case so long as they are decorative articles of wristwatch. Accordingly, it is important that the surface of even decorative article of wristwatch produced of an insulating material is rendered insusceptible to scratches by enhancing abrasion resistance and is improved in the quality of decorativeness in terms of the external appearance by improving corrosion resistance so as to provide a high-class feeling to the external appearance of, especially a wristwatch, to be produced.

The invention has been developed to solve the problems described above, and it is an object of the invention to provide a soft metal and a method of producing the same, and a decorative article of wristwatch and a method of producing the same, wherein the surface thereof is rendered insusceptible to scratches by enhancing abrasion resistance and initiation of corrosion is prevented by improving corrosion resistance so as to provide excellent durability and a high-class feeling to the external appearance.

DISCLOSURE OF THE INVENTION

A soft metal according to the invention is characterized in that a hard layer containing zirconium and molybdenum is formed on a surface thereof. This hard layer either in the crystal phase and amorphous phase is high in Vickers hardness and mechanical strength. Further, the hard layer has a property of initiating no corrosion even if it is brought into contact with a substance exhibiting acidity or alkalinity by immersion therein for a long time.

Further, in the soft metal, the hard layer may contain an additive element comprising at least one or more elements selected from niobium, tantalum, and titanium.

Furthermore, the hard layer is preferably formed through an intermediate hard layer made of an alloy constituted of at least one selected from iron, cobalt, and nickel. In this case, the soft metal is further increased in hardness of the surface, improved in abrasion resistance, and rendered insusceptible to scratches on the surface.

In this soft metal, it is suitable that a content of molybdenum constituting the hard layer is about 30 to 75 wt %. When the hard layer contains the additive elements, it is preferable that a content of molybdenum constituting the hard layer is about 25 to 65 wt %, and a total content of the additive elements is about 25 wt % or less. Besides, when the hard layer contains the additive elements, it is also adoptable that a total content of molybdenum and additive elements constituting the hard layer is about 30 wt % or more and about 80 wt % or less. When these conditions are satisfied, the hard layer is high in abrasion resistance and corrosion resistance to provide a more preferable soft metal that is the object of the invention.

Further, in the soft metal, it is preferable that a content of molybdenum constituting the hard layer is about 30 to 60 wt %, and when the hard layer contains the additive elements, it is also preferable that a total content of molybdenum and additive elements constituting the hard layer is about 30 to 55 wt %. In this case, the hard layer is in the amorphous phase, so that the surface of the soft metal becomes a mirror surface, resulting in a smooth film similar to the film formed by the CVD method.

Further, the invention provides a method of producing a soft metal, comprising steps of: disposing a soft metal and an alloy target containing zirconium and molybdenum inside a vacuum apparatus; evacuating the vacuum apparatus and then introducing an inert gas thereinto and causing an inert gas plasma to occur; and forming a hard layer made of metals constituting the alloy target on a surface of the soft metal in an inert gas plasma atmosphere in which the inert gas plasma is caused to occur.

Further, the invention provides a method of producing a soft metal, comprising steps of: disposing a soft metal and a first alloy target containing at least one selected from iron, cobalt, and nickel inside a vacuum apparatus; evacuating the vacuum apparatus, then introducing an inert gas thereinto and causing an inert gas plasma to occur; forming an intermediate hard layer made of metals constituting the first alloy target on a surface of the soft metal in an inert gas plasma atmosphere in which the inert gas plasma is caused to occur; and subsequently disposing a second alloy target containing zirconium and molybdenum inside the vacuum apparatus, causing an inert gas plasma to occur, and forming a hard layer made of metals constituting the second alloy target on a surface of the intermediate hard layer in an atmosphere of the inert gas plasma.

In these methods of producing a soft metal, it is possible that the alloy target or the second alloy target contains an additive element constituted of at least one or more elements selected from niobium, tantalum, and titanium.

Besides, the invention provides a decorative article of wristwatch wherein a hard layer containing zirconium and molybdenum is formed on a surface of a metal decorative base material made of a soft metal.

In the decorative article of wristwatch, the hard layer may contain an additive element constituted of at least one or more elements selected from niobium, tantalum, and titanium.

Further, it is preferable that the hard layer is formed through an intermediate hard layer made of an alloy containing at least one selected from iron, cobalt, and nickel.

Further, in the decorative article of wristwatch, it is suitable that a content of molybdenum constituting the hard layer is about 30 to 75 wt %. When the hard layer contains the additive elements, it is preferable that a content of molybdenum constituting the hard layer is about 25 to 65 wt %, and a total content of the additive elements is about 25 wt % or less. Further, when the hard layer contains the additive elements, it is also adoptable that a total content of molybdenum and additive elements constituting the hard layer is about 30 to 80 wt %.

In the decorative article of wristwatch, it is suitable that a content of molybdenum constituting the hard layer is about 30 to 60 wt %, and when the hard layer contains the additive elements, it is preferable that a total content of molybdenum and additive elements constituting the hard layer is about 30 to 55 wt %.

Further, the invention provides a decorative article of wristwatch wherein a hard layer containing zirconium and molybdenum is formed on a surface of an insulating decorative base material made of an insulator.

In the decorative article of wristwatch, the hard layer may contain an additive element constituted of at least one or more elements selected from niobium, tantalum, and titanium.

It is preferable that the hard layer is formed through an intermediate layer made of resin.

Further, it is more preferable that a protective film made of a transparent resin is formed on a surface of the hard layer.

Further, in the decorative article of wristwatch, it is suitable that a content of molybdenum constituting the hard layer is about 30 to 75 wt %. When the hard layer contains additive elements, it is preferable that a content of molybdenum constituting the hard layer is about 25 to 65 wt %, and a total content of the additive elements is about 25 wt % or less.

Further, in the decorative article of wristwatch, it is suitable that a content of molybdenum constituting the hard layer is about 30 to 60 wt %. When the hard layer contains additive elements, it is preferable that a total content of molybdenum and additive elements constituting the hard layer is about 30 to 55 wt %.

The insulating decorative base material is preferably made of resin or ceramics.

Besides, it is suitable that the hard layer is a metal film formed by sputtering.

Furthermore, the invention provides a method of producing a decorative article of wristwatch, comprising steps of: disposing a metal decorative base material made of a soft metal and an alloy target containing zirconium and molybdenum inside a vacuum apparatus; evacuating the vacuum apparatus, then introducing an inert gas thereinto and causing an inert gas plasma to occur; and forming a hard layer made of metals constituting the alloy target on a surface of the metal decorative base material in an inert gas plasma atmosphere in which the inert gas plasma is caused to occur.

Further, a method of producing a decorative article of wristwatch when the intermediate hard layer is formed, comprises steps of: disposing a metal decorative base material made of a soft metal and a first alloy target containing at least one selected from iron, cobalt, and nickel inside a vacuum apparatus; evacuating the vacuum apparatus, then introducing an inert gas thereinto and causing an inert gas plasma to occur; forming an intermediate hard layer made of metals constituting the first alloy target on a surface of the metal decorative base material in an inert gas plasma atmosphere in which the inert gas plasma is caused to occur; and subsequently disposing a second alloy target containing zirconium and molybdenum inside the vacuum apparatus, causing an inert gas plasma to occur, and forming a hard layer made of metals constituting the second alloy target on a surface of the intermediate hard layer in an atmosphere of the inert gas plasma.

Furthermore, the invention provides a method of producing a decorative article of wristwatch, comprising steps of: disposing an insulating decorative base material made of an insulator and an alloy target containing zirconium and molybdenum inside a vacuum apparatus; evacuating the vacuum apparatus, then introducing an inert gas thereinto and causing an inert gas plasma to occur; and causing atoms of metals constituting the alloy target to adhere to a surface of the insulating decorative base material in an inert gas plasma atmosphere in which the inert gas plasma is caused to occur, to thereby form a hard layer composed of the atoms of the metals on the surface of the insulating decorative base material.

In these methods of producing a decorative article of wristwatch, it is possible that the alloy target or the second alloy target contains an additive element constituted of at least one or more elements selected from niobium, tantalum, and titanium.

BEST MODE FOR CARRYING OUT THE INVENTION

Preferred embodiments of a soft metal and a method of producing the same, and a decorative article of wristwatch and a method of producing the same, according to the invention, are described in detail hereinafter with reference to the accompanying drawings.

First Embodiment

1) A Structure of a Soft Metal and a Method of Producing the Same

Figure 1:
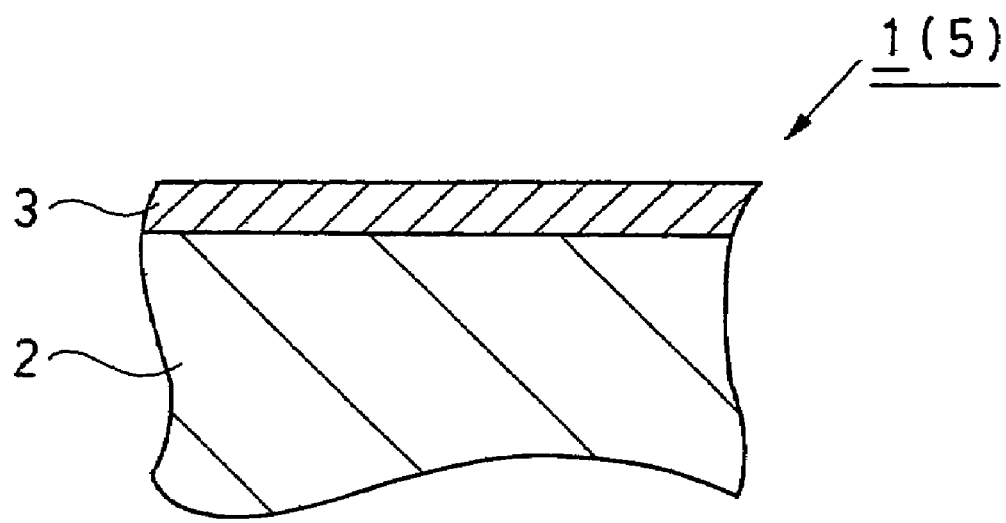
FIG. 1 and FIG. 2 are enlarged schematic sectional views each showing the principal part of a soft metal according to the invention.
Figure 2:
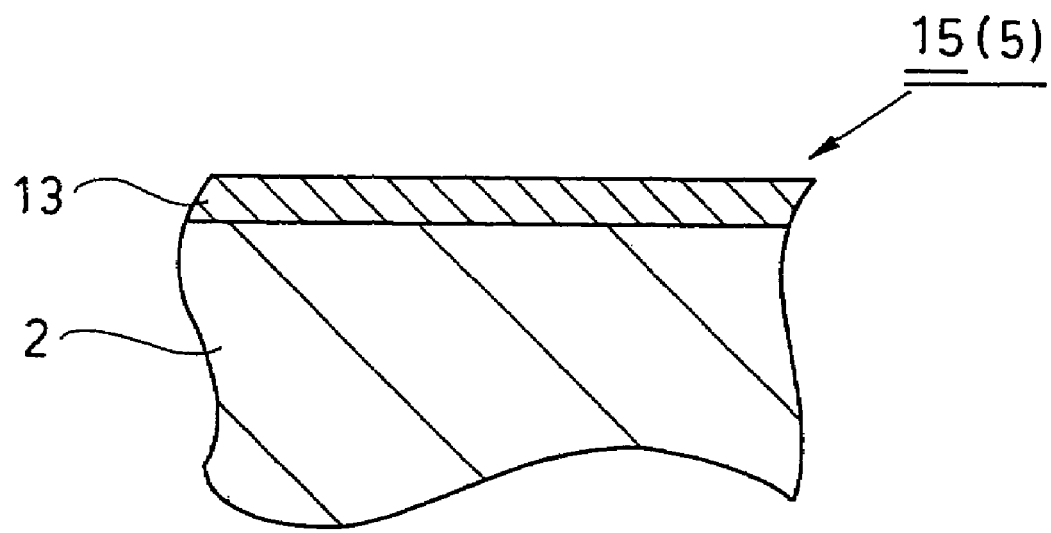

FIG. 1 is an enlarged schematic sectional view showing the principal part of a soft metal 1 according to the invention, and FIG. 2 is a similar enlarged schematic sectional view showing the principal part of a soft metal 15. The soft metal 1 is composed of a soft metal portion 2 and a hard layer 3 containing zirconium (Zr) and molybdenum (Mo) formed on the surface of the soft metal portion 2. The soft metal 15 is composed of a soft metal portion 2 and a hard layer 13 formed on the surface of the soft metal portion 2, wherein the hard layer 13 contains Zr and Mo and further an additive element comprising at least one or more elements having homogeneous solubility with Zr and Mo, that is, selected from niobium (Nb), tantalum (Ta), and titanium (Ti). It should be noted that both of the hard layer 3 and the hard layer 13 are thin in thickness in comparison with the soft metal portions 2, omitting therefore the hard layer 3 and the hard layer 13 on both the right and left sides as well as the underside of the soft metal portions 2 in FIG. 1 and FIG. 2.

The hard layer 3 and the hard layer 13 in both crystal phase and amorphous phase are high in Vickers hardness and mechanical strength. Further, the hard layer 3 and the hard layer 13 have a property of initiating no corrosion even if they are in contact with a substance exhibiting acidity or alkalinity by immersion therein for a long time. Therefore, the soft metal 1 and the soft metal 15 are excellent in abrasion resistance and corrosion resistance owing to the hard layer 3 and the hard layer 13 formed thereon, respectively.

Next, structures of the soft metal 1 and the soft metal 15, methods of producing the same, and effects of the same are described in detail. It should be noted that the soft metal 1 and the soft metal 15 are different only in composition of the hard layer formed on the surface and are the same in the other structure and method of producing the same, and therefore they are described by taking an example of a soft metal article 5 described hereinafter.

The soft metal article 5 is produced by using a soft metal article 6 obtained by working a soft metal, such as stainless steel, iron base alloy, titanium, titanium alloy, aluminum, aluminum alloy, brass, copper, copper alloy, magnesium, or magnesium alloy, into desired shapes of various components, and by forming the hard layer 3 or the hard layer 13 on the surface of the soft metal article 6. The soft metal article 5 having the hard layer 3 formed thereon corresponds to the soft metal 1, and the soft metal article 5 having the hard layer 13 formed thereon corresponds to the soft metal 15.

The soft metal article 5 is produced in the following manner.

Figure 5:
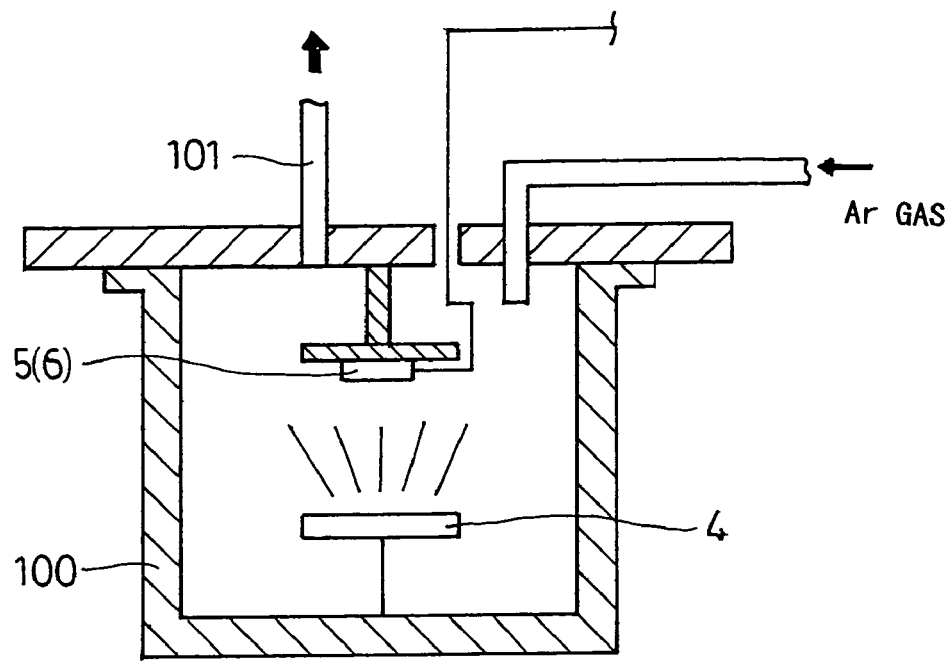
FIG. 5 and FIG. 6 are schematic sectional views each showing the configuration in a vacuum apparatus in which a hard layer is formed on the surface of a soft metal or a decorative article of wristwatch.

As shown in FIG. 5, the soft metal article 6 and an alloy target 4 are first disposed inside a vacuum apparatus 100. As the alloy target 4, an alloy containing Zr and Mo (hereinafter referred to as a "Zr—Mo alloy") and an alloy containing Zr and Mo and the above-described additive element (hereinafter referred to as a "Zr—Mo additive element alloy") are prepared. The former is used to form the hard layer 3, and the latter is used to form the hard layer 13. Subsequently, the vacuum apparatus 100 is evacuated through a pump 101, and thereafter, an inert gas (for example, an argon (Ar) gas) is introduced therein, an internal pressure is maintained in the order of 3 ×10$^{-3}$ Torr (about 0.4 Pa), and an inert gas plasma is caused to occur. In such an inert gas plasma atmosphere, a film made of metals constituting the alloy target 4 is formed on the surface of the soft metal article 6 by a sputter method (also called a sputtering method), resulting in the soft metal article 5. Here, the use of the Zr—Mo alloy for the alloy target 4 results in the soft metal article 5 having the hard layer 3 formed on the surface thereof, and the use of the Zr—Mo additive element alloy results in the soft metal article 5 having the hard layer 13 formed on the surface thereof.

Figure 3:
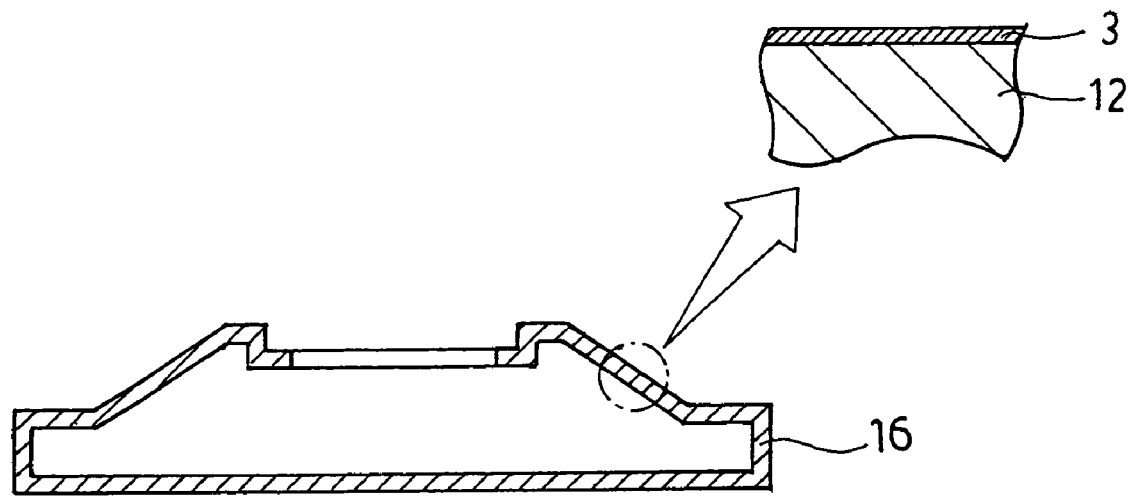
FIG. 3 and FIG. 4 are schematic sectional views each showing a decorative article of wristwatch and an enlarged principal part thereof.
Figure 4:
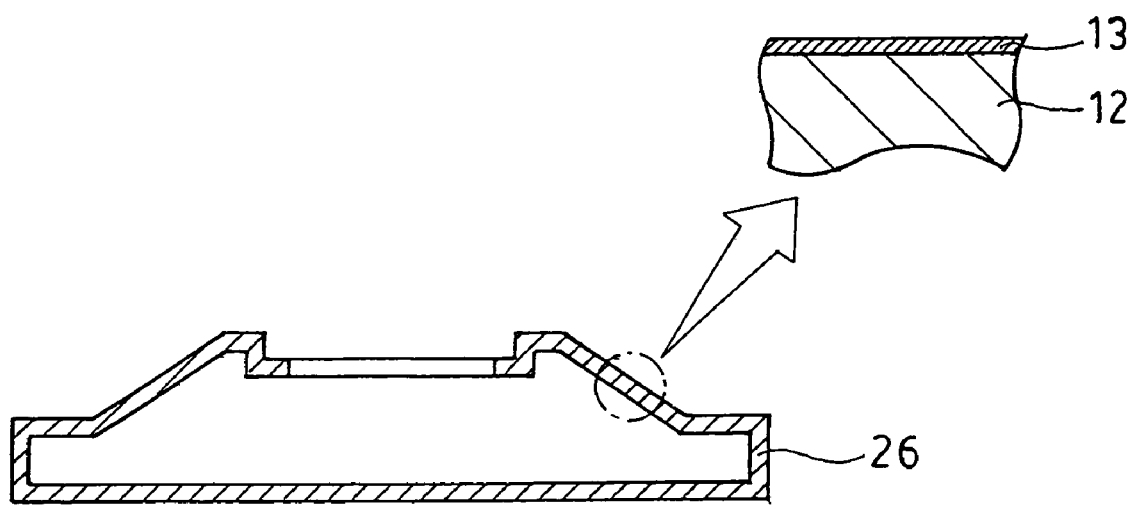

2) A Structure of a Decorative Article of Wristwatch and a Method of Producing the Same Next, a structure of a decorative article of wristwatch and a method of producing the same are described. FIG. 3 is a schematic sectional view showing a wristwatch case 16 being an example of a decorative article of wristwatch according to the invention and an enlarged principal part thereof, and FIG. 4 is a similar schematic sectional view showing a wristwatch case 26 and an enlarged principal part thereof. The wristwatch case 16 has the above-described hard layer 3 formed on the surface of a metal decorative base material 12 made of a soft metal, and the wristwatch case 26 has the hard layer 13 formed on the surface of a metal decorative base material 12.

The wristwatch cases 16 and 26 are high and excellent in abrasion resistance and corrosion resistance, similarly to the soft metals 1 and 15, owing to the hard layer 3 and the hard layer 13 formed thereon, respectively. Accordingly, the wristwatch cases 16 and 26 are rendered insusceptible to scratches on the surface and have high quality in terms of decorativeness of the external appearance, and thus can provide a high-class feeling to the external appearance when used especially for a wristwatch.

Figure 6:
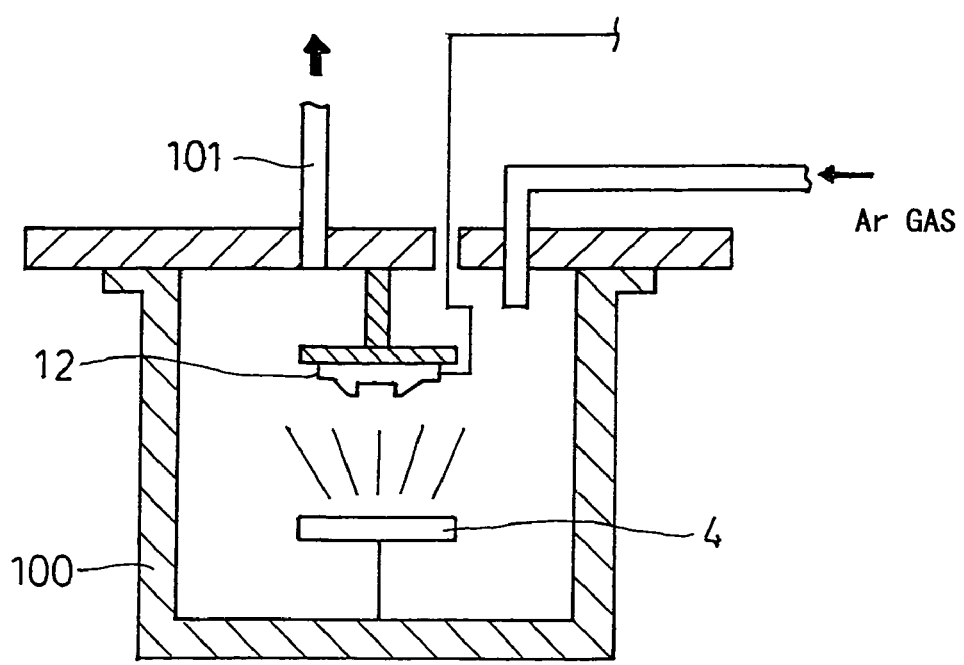

The wristwatch cases 16 and 26 are produced using the metal decorative base material 12 having a shape of a wristwatch case in the same method as that of the soft metal article 5. More specifically, as shown in FIG. 6, the metal decorative base material 12 and an alloy target 4 are disposed inside a vacuum apparatus 100. As the alloy target 4, a Zr—Mo alloy target and a Zr—Mo additive element alloy target are prepared respectively. Subsequently, the vacuum apparatus 100 is evacuated through a pump 101, thereafter, an inert gas is introduced therein and an internal pressure is maintained in the order of, for example, 3×10$^{-3}$ Torr (about 0.4 Pa), and an inert gas plasma is caused to occur. In such an inert gas plasma atmosphere, a film made of metals constituting the alloy target 4 is formed on the surface of the metal decorative base material 12 by a sputter method, thereby forming the wristwatch case 16 or 26. Here, the use of the Zr—Mo alloy for the alloy target 4 results in the wristwatch case 16, and the use of the Zr—Mo additive element alloy results in the wristwatch case 26.

3) First Examples of the Soft Metal and the Decorative Article of Wristwatch

Figure 13:
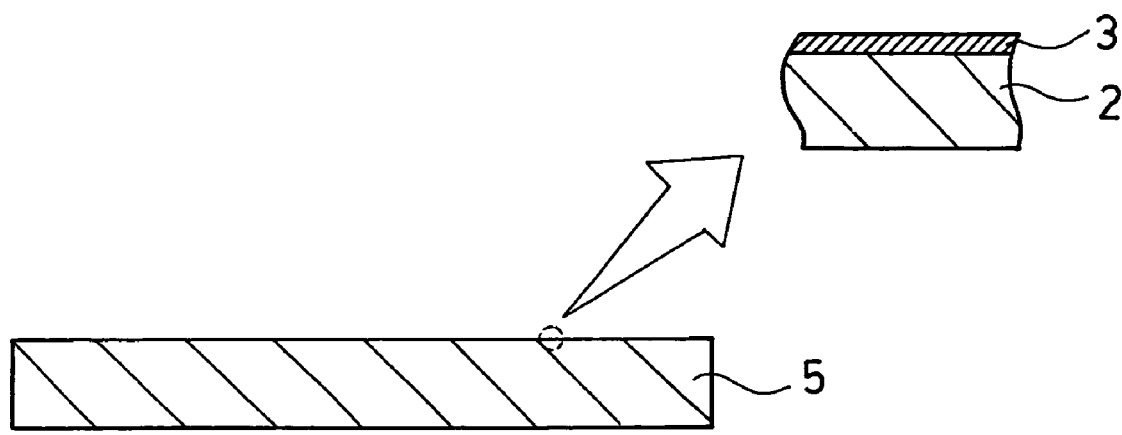
FIG. 13 is a schematic sectional view showing a flat plate-shaped soft metal article and an enlarged principal part thereof, a part (1) showing a soft metal article having a hard layer 3 formed thereon and a part (2) showing a soft metal article having a hard layer 13 formed thereon.
Figure 13:
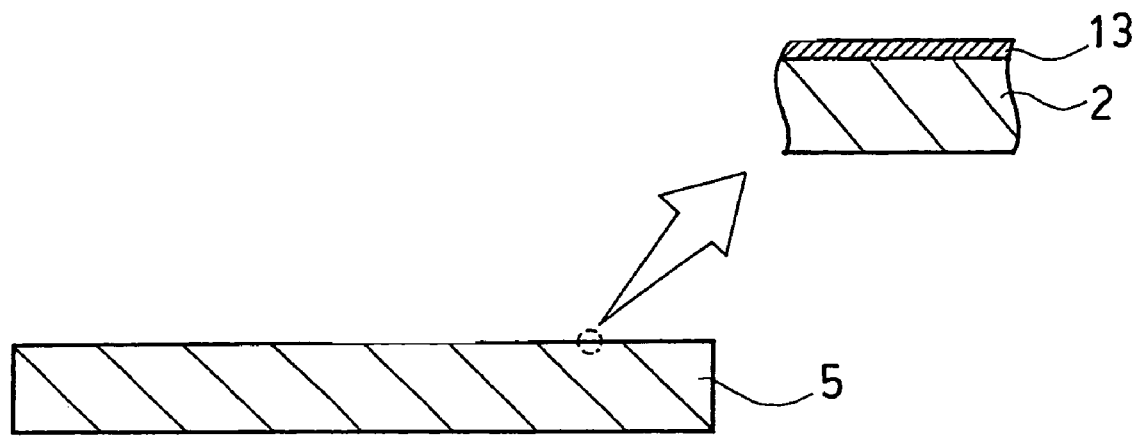

Concrete examples (samples) of the above-described soft metal and decorative article of wristwatch were produced. Those examples are described with reference to Table 1 to Table 3. The soft metal articles 5 were produced here according to the above-described procedure using a flat plate-shaped soft metal article as shown in FIG. 13. In this event, for the soft metal as the material, five kinds of metals in total were used, that is, two kinds of stainless steels (SUS316L and SUS304), titanium (Ti), brass, and aluminum (Al). As the alloy target 4, several kinds of Zr—Mo alloys and Zr—Mo additive element alloys were prepared respectively by appropriately changing the composition of the respective metals.

As the decorative articles of wristwatch, in addition to the above-described wristwatch cases 16 and 26, several kinds of wristwatch bezels, (hereinafter referred to as "bezels"), wristwatch bands, wristwatch case backs (hereinafter referred to as "case backs"), and clasps were prepared using appropriate soft metals from among those similar to the soft metal articles 5. As the alloy target 4, several kinds of Zr—Mo alloys and Zr—Mo additive element alloys were prepared respectively by appropriately changing the composition of the respective metals.

Further, samples (comparative examples) for comparison with the examples of the soft metal articles 5 thus produced were also prepared. The comparative examples are formed using stainless steel (SUS316L) and titanium (Ti) with a Ni—P electroplating film formed on the surface thereof by a wet electroplating process. Further, comparative examples (comparative examples 5 to 20) for obtaining more preferable soft metals and decorative articles of wristwatch that are the object of the invention were also produced.

With each of the produced examples and comparative examples of the soft metal articles 5 and decorative articles of wristwatch, the film formed thereon was subjected to the ICP-AES (Inductively Coupled Plasma-Atomic Emission Spectroscopy), whereby the alloying composition thereof was checked. The result of this is presented as a "composition of a hard layer." Besides, as the items for evaluating the characteristics of the film (hereinafter these items being referred to as "evaluation items"), four items of "hardness," "surface roughness," "adhesion property," and "corrosion resistance" were selected, and reference values were set for the respective items so that conditions were examined for obtaining a more preferable soft metal and decorative article of wristwatch that are the object of the invention. The evaluation was made on the respective items according to the following procedure.

The "hardness" of the surface of the film was measured with a Vickers hardness tester, and the film having a Vickers hardness under the condition of a load of 50 gf of Hv=600 or more was determined as acceptable. As for the "surface roughness," the average surface roughness Ra was measured with a surface roughness gauge, and the film having an Ra of 0.4 μm or less was determined as acceptable. As for the "adhesion property," a scratch test by scratching the surface of the film was conducted to measure a peeling starting load, and the film having a peeling starting load of 500 gf or more was determined as acceptable. As for the corrosion resistance, the film in which no corrosion occurred at all after immersion of the film in a CASS testing (Copper Accelerated Acetic Acid Salt Splay testing) solution for 48 hours was determined as acceptable. Then, the film evaluated as acceptable on all the four items "hardness," "surface roughness," "adhesion property," and "corrosion resistance" was determined as acceptable in overall evaluation, and the film evaluated as unacceptable on one of them was determined as unacceptable in overall evaluation. The evaluation results are as follows.

A) The Case of Using a Zr—Mo Alloy

This case is shown in Table 1 and Table 3. As shown in Table 1, comparative examples 1 to 4 are "no" for the corrosion resistance. However, the hardness is Hv=360 (comparative example 3) even at maximum, the surface roughness Ra is 0.1 µm, and the adhesion property is no more than 350 gf (comparative example 3) even at maximum, and therefore these examples are unacceptable in overall evaluation.

In contrast to the above, each of the examples, as shown in examples 1 to 12 in Table 1 and examples 51 to 56 in Table 3, has a hardness Hv=620 or more. Further, the average surface roughness Ra is 0.35 µm or less, and the peeling starting load is 500 gf or more. All the examples have "no" corrosion. Accordingly, the examples 1 to 12 shown in Table 1 and the examples 51 to 56 shown in Table 3 (hereinafter referred to as "first objective examples") are acceptable in overall evaluation.

In addition to the first objective examples, as shown in comparative examples 5 to 10, the hard layer 3 increases in hardness with an increase in Mo content. In consideration of this point, the first objective examples are compared with the comparative examples 5 to 10 shown in Table 3, reaching the following understanding.

In terms of the increase in hardness with an increase in the Mo content, it is only required to increase the Mo content in order to make the film higher in hardness. However, as shown in the comparative examples 5 to 7, when the Mo content reaches 76 wt %, that is, more than 75 wt %, the average surface roughness Ra becomes 0.45 µm. In this event, a hard layer is formed, in which crystalline $Mo_2Zr$ is formed and the crystal grain boundary bulges up, presenting a lot of surface roughness. Therefore, that hard layer might affect the decorativeness of the external appearance of the soft metal and decorative article of wristwatch. Within a range of the Mo content of 75 wt % or less and more than 60 wt %, $Mo_2Zr$ is formed in the hard layer but the crystal grain boundary does not coarsen, presenting little or no surface roughness. Accordingly, the Mo content is acceptably less than 76 wt % and preferably about 75 wt % or less.

On the other hand, as shown in the comparative examples 8 to 10, when the Mo content reaches 29 wt %, that is, less than 30 wt %, the hardness does not satisfy the reference value Hv=600, which might result in a hard layer not sufficiently having properties that are the object of the invention. Accordingly, the Mo content is acceptably more than 29 wt % and preferably about 30 wt % or more.

From the above, the Mo content is acceptably more than 29 wt % and less than 76 wt % and preferably about 30 to 75 wt %. When the Mo content satisfies this condition, a film to be formed is acceptable on all of the four evaluation items as shown in the first objective examples, resulting in a more preferable soft metal and decorative article of wristwatch that are the object of the invention.

B) The Case of Using a Zr—Mo Additive Element Alloy

This case is shown in Table 2 and Table 3. As shown in examples 13 to 46 in Table 2 and examples 57 to 66 in Table 3, the hardness is Hv=610 or more. Further, the average surface roughness Ra is 0.35 µm or less, and the peeling starting load is 500 gf or more. All the examples have "no" corrosion. Accordingly, the examples shown in Table 2 and the examples 57 to 66 shown in Table 3 (hereinafter referred to as "second objective examples") are acceptable in overall evaluation. The second objective examples are compared with comparative examples 11 to 20 shown in Table 3, reaching the following understanding.

Also in this case, it is only required to increase the Mo content in order to make the film higher in hardness. However, as shown in the comparative examples 11 to 14, when the Mo content reaches 66 wt %, that is, more than 65 wt %, the average surface roughness Ra becomes 0.45 µm. In this event, a hard layer is formed, in which crystalline $Mo_2Zr$ is formed and the crystal grain boundary bulges up, presenting a lot of surface roughness. Therefore, that hard layer might affect the decorativeness of the external appearance of the soft metal and decorative article of wristwatch. Accordingly, the Mo content is acceptably less than 66 wt % and preferably about 65 wt % or less.

On the other hand, as shown in the comparative examples 15 to 17, when the Mo content reaches 24 wt %, that is, less than 25 wt %, the hardness does not satisfy the reference value Hv=600, which might result in a hard layer not sufficiently having properties that are the object of the invention. Accordingly, the Mo content is acceptably more than 24 wt % and preferably about 25 wt % or more.

From the above, the Mo content is acceptably more than 24 wt % and less than 66 wt % and preferably about 25 to 65 wt %.

When the total content of additive elements reaches 26 wt %, that is, more than 25 wt % as shown in comparative examples 18 to 20 even if the Mo content satisfies the above described condition, the average surface roughness Ra becomes 0.45 µm. Also in this case, a hard layer is formed, in which crystalline $Mo_2Zr$ is formed and the crystal grain boundary bulges up, presenting a lot of surface roughness. Therefore, that hard layer might affect the decorativeness of the external appearance of the soft metal and decorative article of wristwatch. Accordingly, the total content of additive elements is acceptably less than 26 wt % and preferably about 25 wt % or less.

Further, focusing attention on the total content of Mo and additive elements, the results are as follows. As shown in the comparative examples 11 to 14, when the total content of Mo and additive elements reaches 81 wt %, that is, more than 80 wt %, the average surface roughness Ra becomes 0.45 µm, in which crystalline $Mo_2Zr$ is formed and the crystal grain boundary bulges up, presenting a lot of surface roughness. Besides, as shown in the comparative examples 15 to 17, when the total content of Mo and additive elements reaches 29 wt %, that is, less than 30 wt %, the hardness does not satisfy the reference value Hv=600, which might result in a hard layer not sufficiently having properties that are the object of the invention. Within a range of the total content of Mo and additive elements of 80 wt % or less and more than 55 wt %, $Mo_2Zr$ is formed in the hard layer but the crystal grain boundary does not coarsen, presenting little or no surface roughness. Accordingly, the total content of Mo and additive elements is acceptably more than 29 wt % and less than 81 wt % and preferably about 30 to 80 wt %.

In summary, in the case of the hard layer made of a Zr—Mo additive element alloy, when the following conditions a) and b) are satisfied, or when the condition c) is satisfied, a preferable soft metal and decorative article of wristwatch that are the object of the invention can be obtained.

a) The Mo content is more than 24 wt % and less than 66 wt %, and the Mo content is preferably about 25 to 65 wt %.

b) The total content of additive elements is less than 26 wt % and preferably about 25 wt % or less.

c) The total content of Mo and additive elements is more than 29 wt % and less than 81 wt %, and the total content of Mo and additive elements is preferably about 30 to 80 wt %.

4) Second Examples of the Soft Metal and the Decorative Article of Wristwatch

For the above-described soft metal and decorative article of wristwatch, examples (samples) having a hard layer in the amorphous phase were produced by devising the composition of the alloy target. For the soft metal as the material, two kinds of metals were used, that is, stainless steel (SUS 304) and brass when the alloy target 4 is a Zr—Mo alloy, and four kinds of metals were used, that is, stainless steels (SUS 304 and SUS316L), titanium, and brass when the alloy target 4 is a Zr—Mo additive element alloy. In any case, the soft metal articles were flat plate-shaped soft metal articles and the decorative articles of wristwatch were wristwatch cases, bezels, wristwatch bands, and case backs.

Further, with each of the produced soft metals and decorative articles of wristwatch, crystallinity of the formed film was checked in addition to the above-described evaluation items. As for the crystallinity, measurement by the X-ray diffraction (θ-2θ method) was conducted making an evaluation such that the film showing a broad peak typical of an amorphous alloy was determined as being in the amorphous phase while the film showing a crystal peak as observed was determined as being in the crystalline phase. The evaluation results are as follows.

A) The Case of Using a Zr—Mo Alloy

This case is shown in Table 4. As described above, the hard layers both in the crystalline phase and the amorphous phase have properties of being high in Vickers hardness and mechanical strength and having no corrosion at all even if they are brought into contact with a substance exhibiting acidity or alkalinity. Accordingly, a preferable soft metal and decorative article of wristwatch that are the object of the invention can be obtained even with any evaluation of the crystallinity. The hard layer, however, comes to have a mirror surface into a smooth film similar to the film formed by the CVD method when its crystallinity is in the amorphous phase, and thus has a property that even if touched with a finger, the surface is insusceptible to a fingerprint left thereon. Accordingly, when the hard layer is in the amorphous phase, the layer can make the soft metal and decorative article of wristwatch better in decorativeness of the external appearance to provide a high-class feeling, resulting in a preferable decorative article especially for a wristwatch.

As shown in examples 203 to 216, when the Mo content is 30 wt % or more and 60 wt % or less, the examples are acceptable in overall evaluation, in which the film (hard layer) is in the amorphous phase. On the other hand, as in examples 201 and 202, when the Mo content is more than 60 wt %, the examples are acceptable in overall evaluation, but crystalline $Mo_2Zr$ is formed so that the hard layer is in the crystalline phase. Since there might be a case that is not acceptable in overall evaluation when the Mo content is less than 30 wt %, the Mo content is preferably about 30 wt % or more. When the Mo content is about 30 to 60 wt %, no crystalline $Mo_2Zr$ is formed, so that the hard layer is in the amorphous phase. Therefore, to form the hard layer in the amorphous phase, the Mo content is preferably about 30 to 60 wt %.

B) The Case of Using a Zr—Mo Additive Element Alloy

This case is shown in Table 5. As shown in examples 304 to 348, when the total content of Mo and additive elements is 30 to 55 wt %, the examples are acceptable in overall evaluation in which the film (hard layer) is in the amorphous phase. On the other hand, as in examples 301, 302, and 303, when the total content of Mo and additive elements is more than 55 wt %, the examples are acceptable in overall evaluation, but crystalline $Mo_2Zr$ is formed so that the hard layer is in the crystalline phase. Since there might be a case that is not acceptable in overall evaluation when the total content of Mo and additive elements is less than 30 wt %, the total content of Mo and additive elements is preferably about 30 wt % or more. When the total content of Mo and additive elements is about 30 to 55 wt %, no crystalline $Mo_2Zr$ is formed, so that the hard layer is in the amorphous phase. Therefore, to form the hard layer in the amorphous phase, the total content of Mo and additive elements is preferably about 30 to 55 wt %.

Second Embodiment

1) A Structure of a Soft Metal and a Method of Producing the Same

Figure 7:
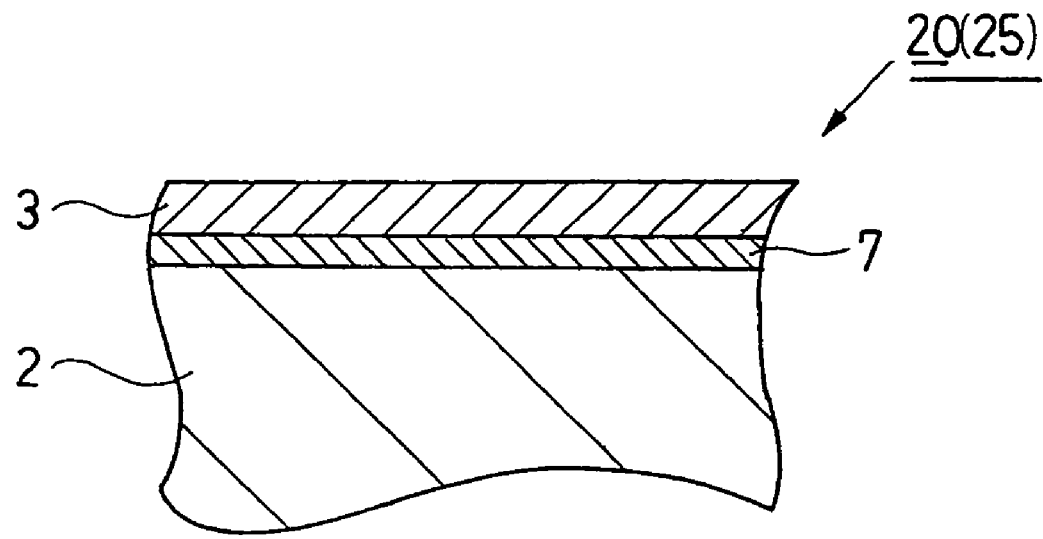
FIG. 7 and FIG. 8 are enlarged schematic sectional views each showing the principal part of a soft metal having a hard layer formed thereon through an intermediate hard layer.
Figure 8:
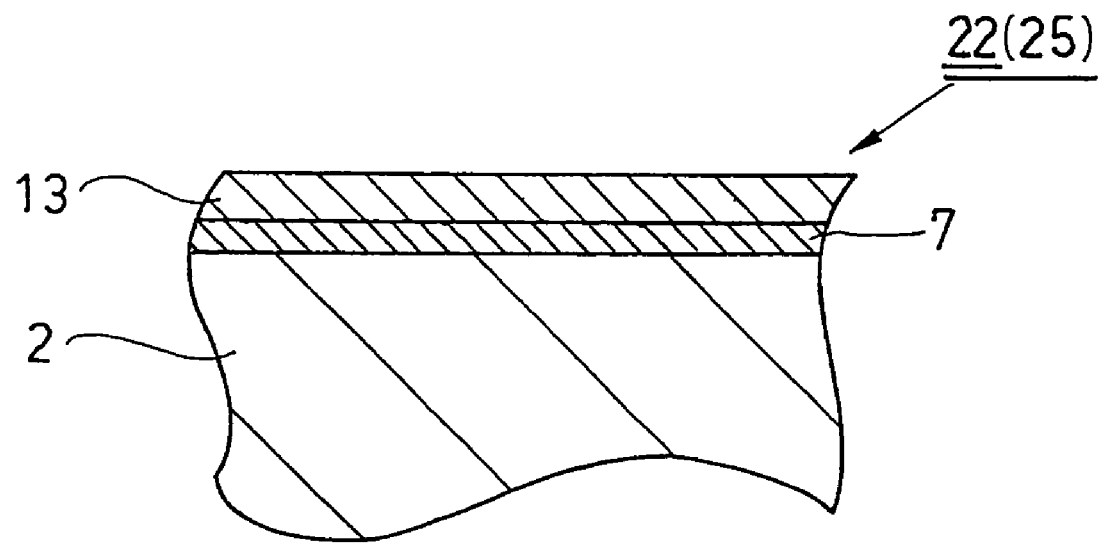

FIG. 7 is an enlarged schematic sectional view showing the principal part of a soft metal 20 according to the invention, and FIG. 8 is a similar enlarged schematic sectional view showing the principal part of a soft metal 22. The soft metal 20 is composed of a soft metal portion 2, an intermediate hard layer 7 formed on the surface of the soft metal portion 2, and a hard layer 3 formed through the intermediate hard layer 7. The soft metal 22 is composed of a soft metal portion 2, an intermediate hard layer 7 formed on the surface of the soft metal portion 2, and a hard layer 13 formed through the intermediate hard layer 7. In short, the soft metals 20 and 22 have configurations that are different from those of the above-described soft metals 1 and 15 in that the respective hard layers 3 and 13 are formed through the intermediate hard layers 7, and are the same in other points.

The intermediate hard layer 7 is made of an alloy containing at least one selected from iron, cobalt, and nickel, which is a cobalt(Co)-zirconium(Zr) alloy or a cobalt(Co)-niobium (Nb)-zirconium(Zr) alloy in this embodiment. When the hard layers 3 or 13 are formed through the intermediate hard layers 7, the hard layers 3 or 13 are formed on the surfaces of the soft metals 20 and 22 together with the intermediate hard layers 7, so that the surfaces of the soft metals 20 and 22 are further increased in hardness as compared with those of the soft metals 1 and 15 and improved in abrasion resistance, so as to be insusceptible to scratches. The intermediate hard layers 7, however, are formed on the surfaces of the soft metals 20 and 22 and thus susceptible to the material thereof. Accordingly, there might be a case that the surface of the soft metal does not increase in hardness even if the intermediate hard layer is formed thereon, depending on the material (in the case of brass, Al, or the like which are softer among soft metals) of the soft metal.

The intermediate hard layer 7 may be an alloy having the following composition besides the above-described Co—Zr alloy or Co—Nb—Zr alloy. Specifically, the intermediate hard layer 7 may be made of a Fe—Co—Ni—Zr—B alloy, a Fe—Cr—Ni—Zr—B alloy, a Fe—Co—Ni—Nb—Zr—B alloy, a Fe—Co—Ni—Ta—Zr—B alloy, a Fe—Co—Cr—Ni—Nb—Zr—B alloy, a Fe—Co—Cr—Ni—Ta—Zr—B alloy, a Co—Nb—Ti alloy, a Co—Cr alloy, a Co—Ti alloy, Co—Nb alloy, a Co—Ta alloy, a Co—W alloy, a Co—Fe—Nb alloy, a Co—Ni—Nb alloy, a Co—Fe—Zr alloy, a Co—Ni—Zr alloy, a Co—Fe—Nb—Zr alloy, and a Co—Ni—Nb—Zr alloy in any composition.

Further, the intermediate hard layer 7 itself has a function of hardening the surfaces of the soft metals 20 and 22. However, since the intermediate hard layer 7 may contain Co and/or Ni that may cause metal allergy, the intermediate hard layer 7 simply formed on the surface of the soft metal may unintentionally decrease the anti-allergic property of the soft metal for a human body, leading to an unpreferable condition. In contrast, Zr, Nb, Ta, and Ti forming the hard layers 3 and 13 are harmless to a human body on the metal allergic reaction, and Mo is also an element causing no allergic reaction. Therefore, the formation of the hard layer 3 or 13 on the surface of the intermediate layer 7 can enhance the abrasion resistance and corrosion resistance without a decrease in the anti-allergic property of the soft metal for a human body.

Next, structures of the soft metals 20 and 22, methods of producing the same, and effects of the same are described in detail. It should be noted that the soft metal 20 and the soft metal 22 are different only in composition of the hard layer formed on the surface and are the same in the other structure and method of producing the same, and therefore they are described by taking an example of a soft metal article 25 described hereinafter.

The soft metal article 25 is produced by forming a hard layer 3 or a hard layer 13 on the surface of a soft metal article 6 through an intermediate hard layer 7, and the soft metal article 25 having the hard layer 3 formed thereon corresponds to the soft metal 20, and the soft metal article 25 having the hard layer 13 formed thereon corresponds to the soft metal 22.

The soft metal article 25 is produced in the following manner.

Figure 11:
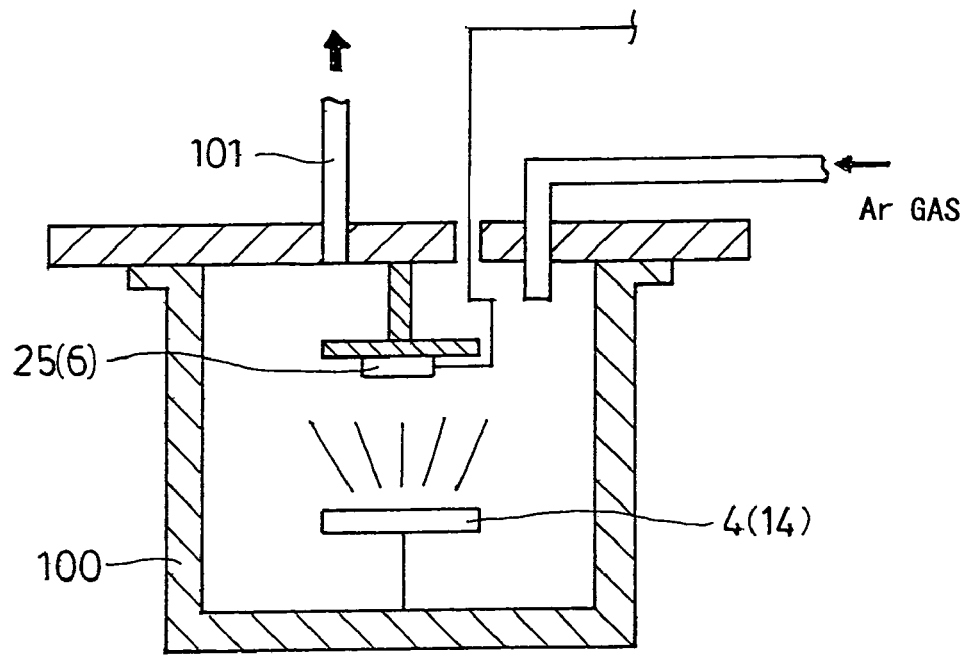
FIG. 11 is and FIG. 12 are schematic sectional views each showing the configuration in a vacuum apparatus in which a hard layer is formed on the surface of a soft metal or a decorative article of wristwatch through an intermediate hard layer.

As shown in FIG. 11, the soft metal article 6 and an alloy target 14 are first disposed inside a vacuum apparatus 100. The alloy target 14 is, for example, a Co—Zr alloy or a Co—Nb—Zr alloy. Subsequently, the vacuum apparatus 100 is evacuated through a pump 101, and thereafter, an inert gas is introduced therein and an internal pressure is maintained in the order of $3 \times 10^{-3}$ Torr (about 0.4 Pa), and an inert gas plasma is caused to occur. In such an inert gas plasma atmosphere, a film made of metals constituting the alloy target 14 is formed on the surface of the soft metal article 6 by a sputter method. This forms the intermediate hard layer 7. Subsequently, an alloy target 4 as a second alloy target is disposed inside the vacuum apparatus 100. As the alloy target 4, a Zr—Mo alloy or a Zr—Mo additive element alloy is used. Subsequently, the internal pressure is maintained in the order of $3 \times 10^{-3}$ Torr (about 0.4 Pa), and an inert gas plasma is caused to occur, and a film made of metals constituting the alloy target 4 is formed on the surface of the intermediate hard layer 7 in the inert gas plasma atmosphere by the sputter method, resulting in the soft metal article 25. Note that the use of the Zr—Mo alloy for the alloy target 4 results in the soft metal article 25 having the hard layer 3 formed on the surface thereof, and the use of the Zr—Mo additive element alloy results in the soft metal article 25 having the hard layer 13 formed on the surface thereof.

Figure 9:
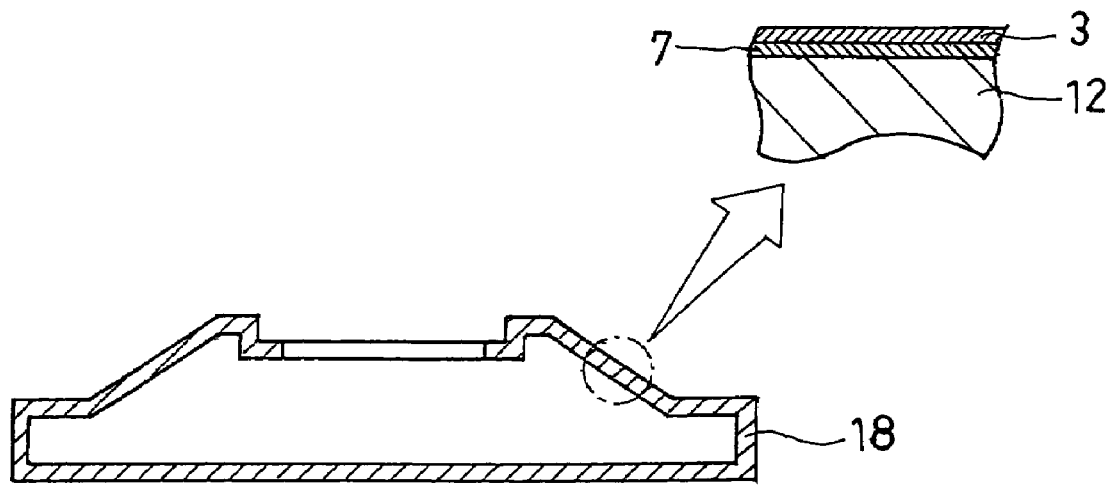
FIG. 9 and FIG. 10 are schematic sectional views each showing a decorative article of wristwatch having a hard layer formed thereon through an intermediate hard layer and an enlarged principal part thereof.
Figure 10:
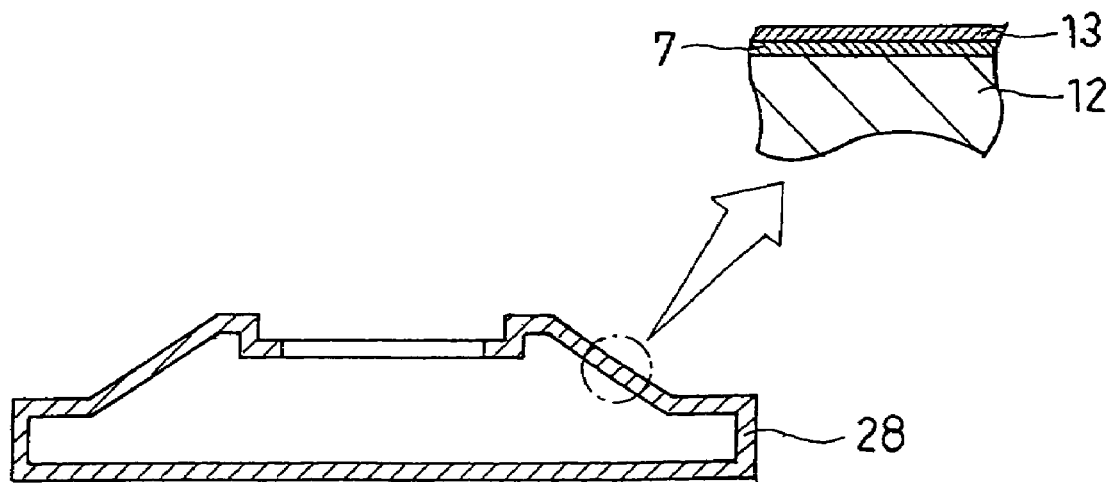

2) A Structure of a Decorative Article of Wristwatch and a Method of Producing the Same Next, a structure of a decorative article of wristwatch and a method of producing the same are described. FIG. 9 is a schematic sectional view showing a wristwatch case 18 being an example of a decorative article of wristwatch according to the invention and an enlarged principal part thereof, and FIG. 10 is a similar schematic sectional view showing a wristwatch case 28 and an enlarged principal part thereof. The wristwatch case 18 has the above-described hard layer 3 formed on the surface of a metal decorative base material 12 through the intermediate hard layer 7, and the wristwatch case 28 has the hard layer 13 formed on the surface of a metal decorative base material 12 through the intermediate hard layer 7.

The wristwatch cases 18 and 28 are high in abrasion resistance and rendered more insusceptible to scratches on the surface, as compared with the wristwatch cases 16 and 26, owing to the hard layers 3 or 13 formed thereon through the intermediate hard layers 7 similarly to the soft metals 20 and 22. Therefore, the wristwatch cases 18 and 28 are of high quality in terms of decorativeness of the external appearance and thus are preferably used to provide a high-class feeling to the external appearance for a wristwatch. Since the wristwatch cases 18 and 28 are apt to come into contact with a human body especially when used for a wristwatch, it is important to form the hard layers 3 or 13 on the intermediate hard layers 7 to prevent a decrease in the anti-allergic property for a human body. In this respect, the wristwatch cases 18 and 28 are useful.

Figure 12:
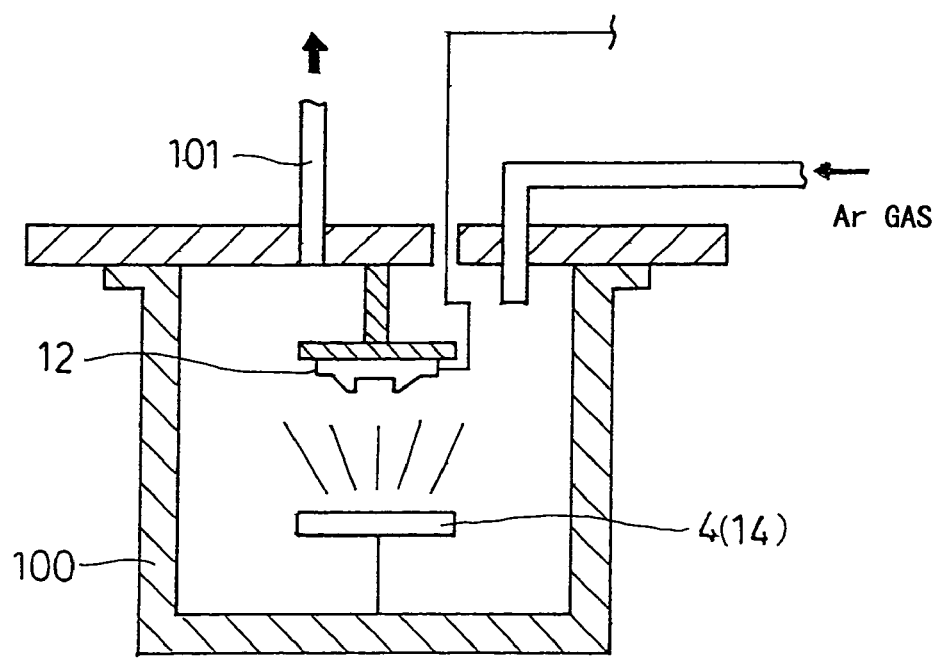

The wristwatch cases 18 and 28 are produced using the metal decorative base material 12 having a shape of a wristwatch case in the same method as that of the soft metal article 25. More specifically, as shown in FIG. 12, the metal decorative base material 12 and an alloy target 14 as a first target are disposed inside a vacuum apparatus 100. As the alloy target 14, a Co—Zr alloy and a Co—Nb—Zr alloy are prepared respectively. Subsequently, the vacuum apparatus 100 is evacuated through a pump 101, thereafter, an inert gas is introduced therein and an internal pressure is maintained at a plasma generable pressure (in the order of $3 \times 10^{-3}$ Torr (about 0.4 Pa)), and an inert gas plasma is caused to occur. In such an inert gas plasma atmosphere, a film made of metals constituting the alloy target 14 is formed on the surface of the metal decorative base material 12 by a sputter method, thereby forming the intermediate hard layer 7. Subsequently, an alloy target 4, as a second alloy target, is disposed inside the vacuum apparatus 100. As the alloy target 4, a Zr—Mo alloy or a Zr—Mo additive element alloy is used. Then, the internal pressure is maintained in the order of $3 \times 10^{-3}$ Torr (about 0.4 Pa), and an inert gas plasma is caused to occur, and a film of metals constituting the alloy target 4 is formed on the surface of the intermediate hard layer 7 in the inert gas plasma atmosphere by the sputter method. Consequently, the hard layer 3 or 13 is formed on the surface of intermediate layer 7, resulting in the wristwatch case 18 or 28 having the hard layers 3 or 13 formed through the intermediate layer 7. Here, the use of the Zr—Mo alloy for the alloy target 4 results in the wristwatch case 18, and the use of the Zr—Mo additive element alloy results in the wristwatch case 28.

3) First Examples of the Soft Metal and the Decorative Article of Wristwatch

Figure 14:
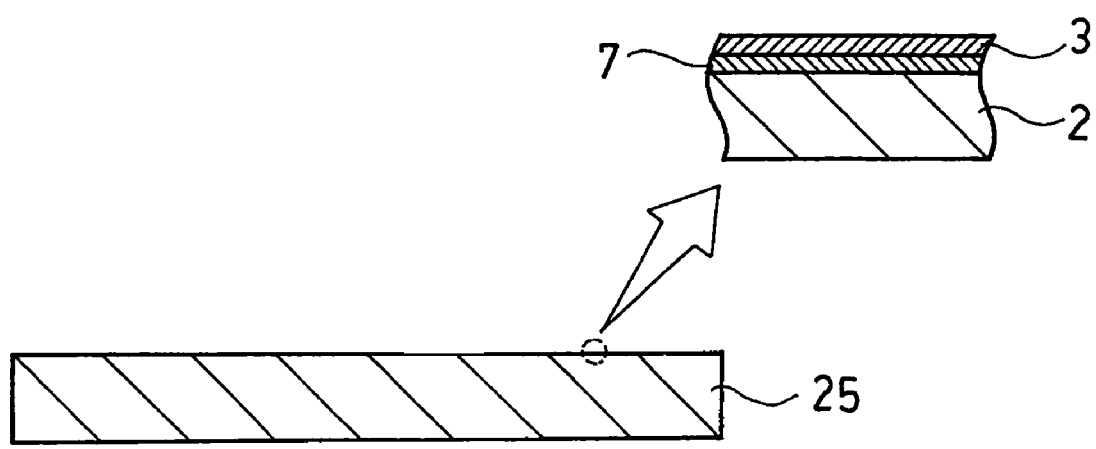
FIG. 14 is a schematic sectional view showing another flat plate-shaped soft metal article and an enlarged principal part thereof, a part (1) showing a soft metal article having a hard layer 3 formed thereon and a part (2) showing a soft metal article having a hard layer 13 formed thereon.
Figure 14:
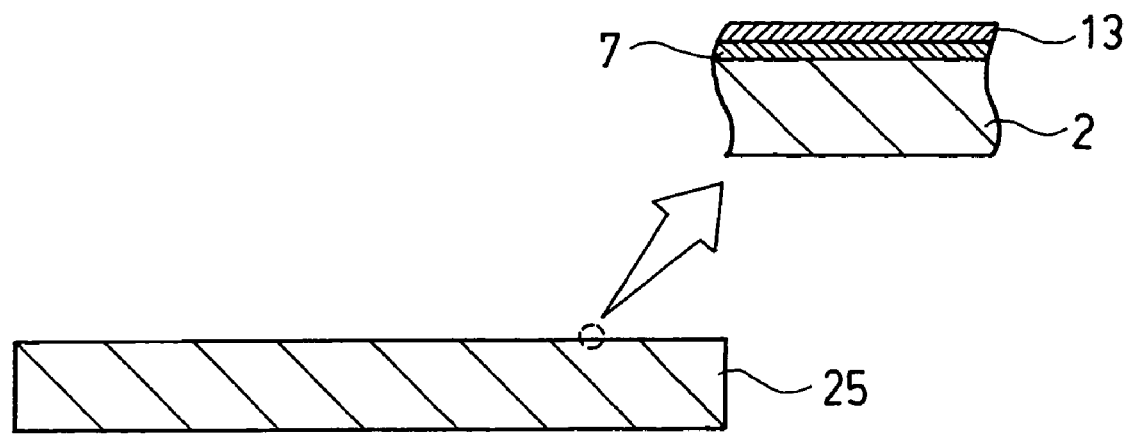

Concrete examples (samples) of the above-described soft metal and decorative article of wristwatch were produced. Those examples are described with reference to Table 6 to Table 8 and a part of Table 3 again. The soft metal articles 25 were produced here according to the above-described procedure using a flat plate-shaped soft metal article as shown in FIG. 14. In this event, for the soft metal as the material, three kinds of metals, that is, Ti, brass, and aluminum (Al) and stainless steels (SUS304 and SUS316L) were used. As the alloy target 4, several kinds of Zr—Mo alloys and Zr—Mo additive element alloys were prepared respectively by appropriately changing the composition of the respective metals.

As the decorative articles of wristwatch, in addition to the above-described wristwatch cases 18 and 28, several kinds of bezels, wristwatch bands, case backs, and clasps were prepared using appropriate soft metals from among those similar to the soft metal articles 25. As the alloy target 4, several kinds of Zr—Mo alloys and Zr—Mo additive element alloys were prepared respectively by appropriately changing the composition of the respective metals.

Further, to check the influence of a change in material of the soft metal on the hardness of each of the soft metals and decorative articles of wristwatch, the examples were prepared in which materials of soft metals are the same as and different from those of the examples shown in Table 1 having no intermediate hard layers.

Then, the above examples of the soft metal articles 25 and decorative articles of wristwatch were subjected to evaluation on the above-described items according to the same procedure as that of the first embodiment. The evaluation results are as follows.

A) The Case of Using a Zr—Mo Alloy

This case is shown in Table 6. In any of the examples having acceptable result in overall evaluation (examples 67 to 84), the Mo content is 30 to 75 wt %. However, when the Mo content is without this range, there arises superiority or inferiority in the evaluation items among the properties of the hard layers as in the first embodiment (see Table 3).

More specifically, when the Mo content is less than 30 wt % as in the comparative examples 8 to 10, the hardness of the hard layer formed decreases to be lower than the reference value and might not provide a soft metal and decorative article of wristwatch having properties that are the object of the invention. Besides, as shown in the comparative examples 5 to 7, when the Mo content is more than 75 wt %, a hard layer is formed, in which crystalline $Mo_2Zr$ is formed and the crystal grain boundary bulges up, presenting a lot of surface roughness. Therefore, that hard layer might affect the decorativeness of the external appearance of the soft metal and decorative article of wristwatch. Within a range of the Mo content 75 wt % or less and more than 60 wt %, $Mo_2Zr$ is formed in the hard layer, but the crystal grain boundary never coarsens, presenting little or no surface roughness.

The difference in hardness depending on the presence or absence of the intermediate hard layer 7 is discussed here by comparing the examples shown in Table 1 with those in Table 6.

In the examples 4 to 6 and 7 to 9 shown in Table 1, the materials of the soft metals are Ti, and the hardnesses thereof are Hv=730, 680, 650 and Hv=940, 920, 780 respectively. In contrast, in the examples 82 to 84 and 67 to 69 shown in Table 6, the materials of the soft metals are the same Ti, but the hardnesses thereof are Hv=750, 690, 680 and Hv=940, 940, 820 respectively. Since the examples 4 to 6 and 7 to 9 shown in Table 1 are the same in composition of the hard layer as the examples 82 to 84 and 67 to 69 shown in Table 6, it would be understood that when the material of the soft metal is Ti, the hardness is kept at the same or increased, even slightly, owing to the formation of the intermediate hard layer 7.

On the other hand, when the intermediate hard layer 7 was formed with the material of the soft metal changed from Ti to Al, the difference is as follows. In the examples 76 to 78 and 73 to 75 shown in Table 6, the hardnesses thereof are Hv=690, 760, 620 and Hv=890, 880, 760 respectively. Therefore, it would be understood that when the intermediate hard layer 7 is formed with the material of the soft metal changed from Ti to Al, the hardness might not increase. It can be considered that this is because the intermediate hard layer 7 is susceptible to the material of the soft metal, and Al and brass that are softer among the soft metals lead to such results.

In summary, the Mo content is acceptably more than 29 wt % and less than 76 wt % and preferably about 30 to 75 wt %. When the Mo content satisfies this condition, a more preferable soft metal and decorative article of wristwatch that are the object of the invention can be obtained. Further, to enhance the abrasion resistance by forming the intermediate hard layer, the soft metal is preferably Ti, stainless steel, or the like that are relatively hard.

B) The Case of Using a Zr—Mo Additive Element Alloy

This case is shown in Table 7 and Table 8.

As shown in the above-described comparative examples 11 to 17, when the Mo content reaches 24 wt % or 66 wt %, that is, less than 25 wt % or more than 65 wt %, there is a case not satisfying the reference value among the evaluation items (hardness or surface roughness) as in the first embodiment. In this case, crystalline $Mo_2Zr$ is formed and the crystal grain boundary bulges up, presenting a lot of surface roughness. Therefore, to obtain a preferable soft metal and decorative article of wristwatch that are the object of the invention, the Mo content is acceptably more than 24 wt % and less than 66 wt %, and the Mo content is preferably about 25 wt % to 65 wt %.

On the other hand, as shown in the comparative examples 18 to 20, there are cases in which the Mo content is about 25 to 65 wt % but the average surface roughness Ra becomes 0.45 μm, and therefore, to eliminate this case, the total content of additive elements is acceptably less than 26 wt % and preferably about 25 wt % or less as in the first embodiment.

Besides, when the overall evaluation is acceptable, the total content of Mo and additive elements is 30 to 80 wt % as shown in Table 7, Table 8, and the examples 57 to 66 in Table 3, while when the total content of Mo and additive elements is without this range as shown in the comparative examples 11 to 17, there is a case not satisfying the reference value among the evaluation items (hardness or surface roughness). Accordingly, the total content of Mo and additive elements is acceptably more than 29 wt % and less than 81 wt % and preferably about 30 to 80 wt %.

In summary, in the case of the hard layer made of a Zr—Mo additive element alloy, when the following conditions d) and e) are satisfied, or when the condition f) is satisfied, a preferable soft metal and decorative article of wristwatch that are the object of the invention can be obtained.

d) The Mo content is more than 24 wt % and less than 66 wt %, and the Mo content is preferably about 25 to 65 wt %.

e) The total content of additive elements is less than 26 wt % and preferably about 25 wt % or less.

f) The total content of Mo and additive elements is more than 29 wt % and less than 81 wt %, and the total content of Mo and additive elements is preferably about 30 to 80 wt %.

4) Second Examples of the Soft Metal and the Decorative Article of Wristwatch

Also in this embodiment, conditions for the hard layer to be in the amorphous phase examined on the above-described soft metal and decorative article of wristwatch according to the same procedure as that of the first embodiment are as follows.

In the case of using a Zr—Mo alloy, when the Mo content is about 30 to 60 wt %, the hard layer is in the amorphous phase. Meanwhile, in the case of using a Zr—Mo additive element alloy, when the total content of Mo and additive elements is about 30 to 55 wt %, the hard layer is in the amorphous phase. In these cases, the surface of the soft metal and decorative article of wristwatch are made smooth and thus insusceptible to a fingerprint left thereon, and can make them better in decorativeness to provide a high-class feeling. Especially, the decorative article of wristwatch becomes preferable for a wristwatch.

Third Embodiment

Figure 21:
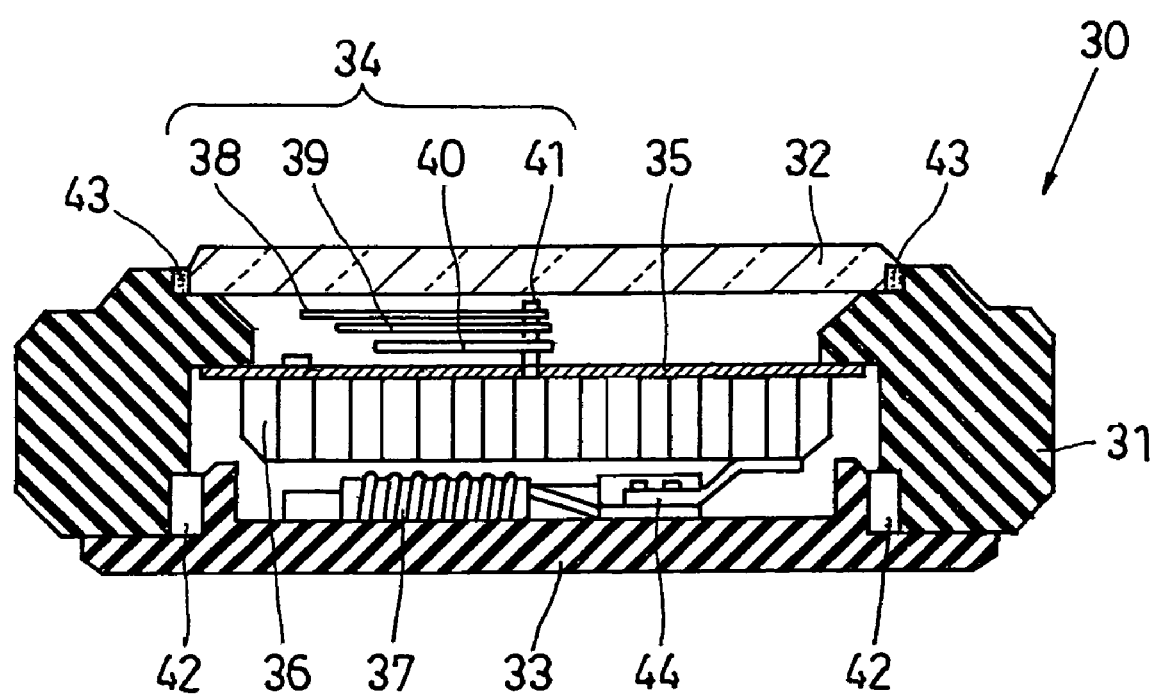
FIG. 21 is a schematic sectional view showing the internal structure of a radio controlled wristwatch using a wristwatch case and a wristwatch case back being examples of the decorative article of wristwatch according to the invention.

1) A Structure of a Decorative Article of Wristwatch and a Method of Producing the Same FIG. 21 is a schematic sectional view showing the internal structure of a radio controlled wristwatch 30 using a wristwatch case 31 and a case back 33 that are examples of the decorative article of wristwatch according to the invention. The radio controlled wristwatch 30 comprises the wristwatch case 31, a glass 32 fixed to the top face thereof, and the case back 33 which form a sealed space, and includes wristwatch hands 34, a dial 35, a movement 36, an antenna 37, and a terminal board 44 in the sealed space.

The radio-controlled wristwatch 30 is a radio adjustable type wristwatch that automatically adjusts the time via a predetermined time radio wave. Therefore, the wristwatch incorporates the antenna 37 for receiving the radio of time. When articles made of metal (metal articles) are arranged near the antenna 37, the metal articles may attenuate the time radio wave and cause reception fault, and therefore decorative articles of wristwatch for the radio-controlled wristwatch, that is, the wristwatch case 31 and the case back 33 in the case of the radio-controlled wristwatch 30, are generally produced using an insulating material such as resin, ceramics or the like.

Figure 15:
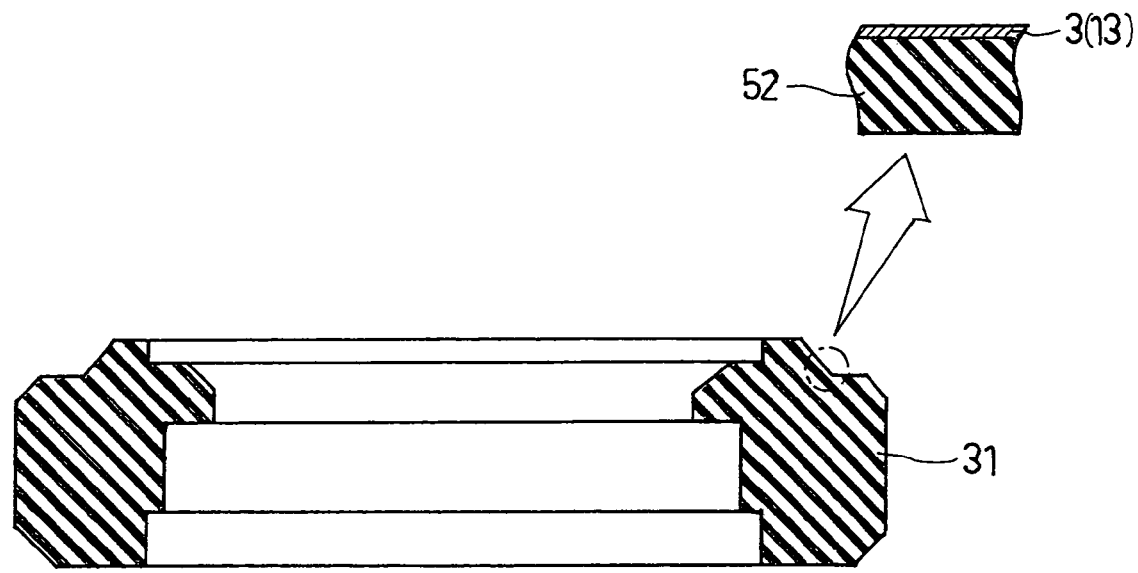
FIG. 15 is a schematic sectional view showing a wristwatch case using an insulating decorative base material and an enlarged principal part thereof.
Figure 16:
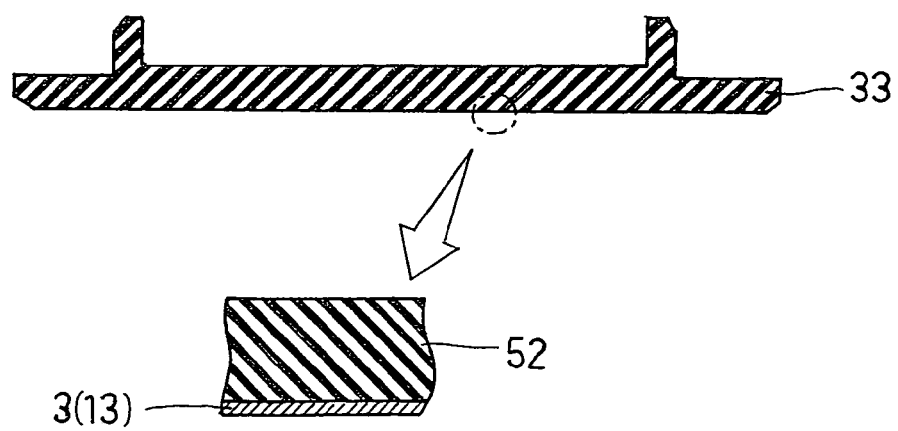
FIG. 16 is a schematic sectional view showing a case back using an insulating decorative base material and an enlarged principal part thereof.

The wristwatch case 31 and the case back 33, as shown in FIG. 15 and FIG. 16 respectively, have a hard layer 3 on the entire outer surface of an insulating decorative base material 52, the hard layer 3 being a metal film containing Zr and Mo as in the above-described respective embodiments. In place of the hard layer 3, a hard layer 13 may be formed that contains Zr and Mo and further an additive element comprising at least one or more elements selected from Nb, Ta, and Ti. Since Zr, Mo, Nb, Ta, and Ti have no magnetism and are low in electric conductivity, they are elements that scarcely cause radio reception fault. Accordingly, formation of the hard layer 3 or 13 composed of these metals on the entire outer surface of the insulating decorative base material 52 provides decorative articles of wristwatch that are very effective especially for the radio-controlled wristwatch. Such decorative articles of wristwatch include a bezel in addition to the wristwatch case 31 and the case back 33.

Besides, there is a technique relating to the invention that produces a wristwatch case for a radio-controlled wristwatch through coating by spraying paint in which metal powder is dispersed onto the surface of a resin molding. There is another technique that produces a wristwatch case for a radio-controlled wristwatch by forming a metal thin film made of Au, Ag, Pd, Pt, Cr, Ni, Cu, or the like on the surface of a case base body made of ceramics (for example, in JP, 2001-305244, A). The former is conducted by coating and thus has difficulty in providing a high-class feeling to the external appearance of the wristwatch case and also has a problem in adhesion of the coating film. Meanwhile, the latter can provide a high-class feeling to the external appearance of the wristwatch case but may decrease the reception sensitivity of the antenna due to the influence of the material and the film thickness of the metal thin film. The wristwatch case 31 and the case back 33 according to the invention, however, are made using the elements that have no magnetism and are low in electric conductivity as the elements constituting the hard layer as described above, so that the decrease in the reception sensitivity of the antenna 37 is limited to fall within an allowable range. Besides, the film thickness of the hard layer limited to fall within a necessary range can decrease the influence on the reception sensitivity and is preferable also in the following points.

More specifically, the hard layers 3 and 13 preferably have a film thickness in the order of about 0.05 μm to about 3 μm. This is because, with a film thickness of less than 0.05 μm, the wristwatch case 31 and the case back 33 are difficult to have an external appearance looking metallic color (hereinafter referred to as "metallic external appearance") and are low in abrasion resistance and insufficient in durability, and with more than 3 μm, surface roughness might occur due to the stress during the film formation. The hard layer 3 (including the hard layer 13) is formed to have a small film thickness as compared with the size of the insulating decorative base material 52.

The insulating decorative base material 52 is made of an insulating material, for example, a thermoplastic resin that has been conventionally in wide use, produced in the shape corresponding to the wristwatch case 31 and the back 33. For the insulating decorative base material 52, a thermoplastic resin having heat resistance of about 200° C. or higher can be used. Specific examples of the resin include engineering plastics such as nylon, polybutylene terephthalate, and the like, or super engineering plastics such as polyphenylene sulfide, polyethersulfone, polyarylate, and the like. Further, for the purpose of enhancing the heat resistance and the mechanical strength, it is adoptable to use for the insulating decorative base material 52 a resin to which reinforcing substance such as carbon fiber, glass fiber, or the like is added. In addition, the wristwatch case 31 and the case back 33 are made for a wristwatch, for which a resin may be used in which powder of metal with a large specific gravity such as tungsten (W) or the like is dispersed to provide a feeling of depth. However, as the powder to be dispersed in the resin to increase the specific gravity, it is preferable to use powder that is a non-magnetic substance in consideration of a radio wave reception performance of the antenna 37.

Further, it is also adoptable to use ceramics, glass, or the like for the insulating decorative base material 52. As the ceramics material, zirconia, alumina, or the like can be used here, among which zirconia is especially preferable because of its superiority in impact resistance and tenacity.

The wristwatch hands 34 are constituted of a second hand 38, a minute hand 39, and an hour hand 40 which are supported by a hand shaft 41 to rotate individually on the dial 35. The dial 35 is formed of an insulator such as resin, ceramics, or the like having a surface printed or embossed with letters or the like indicating time. The movement 36 includes therein a time keeping circuit and a step motor and a train wheel for moving the wristwatch hands 34, and is additionally provided with circuits corresponding to functions to be provided in the radio-controlled wristwatch 30, a reception circuit for receiving the radio wave of time signal through the antenna 37, a display adjustment circuit for adjusting time based on the received signal, and so on. The antenna 37 is connected to the reception circuit in the movement 36 through the terminal board 44.

It should be noted that the radio-controlled wristwatch 30 uses a packing 42 and a packing 43 for the wristwatch case 31, the glass 32, and the case back 33 to form the sealed space. The packing 42 is interposed between the wristwatch case 31 and the case back 33 and is arranged so as to close the gap between them. The packing 43 is interposed between the wristwatch case 31 and the glass 32 and is arranged so as to close the gap between them.

Next, methods of producing the wristwatch case 31 and the case back 33, and effects of the same are described in detail.

The wristwatch case 31 and the case back 33 are produced, for example, in the following manner.

First, in the case of using a thermoplastic resin, the thermoplastic resin is injected to fill molds having cavities corresponding to the respective shapes of the wristwatch case 31 and the case back 33, thereby producing the insulating decorative base materials 52, that is, the insulating moldings for obtaining the wristwatch case 31 and the case back 33. The use of the thermoplastic resin in producing the insulating decorative base materials 52 can easily provide decorative articles of wristwatch in various designs.

Further, methods of producing the insulating decorative base material 52 using ceramics include a slip casting method and a powder injection molding method. In the slip casting method, ceramics powder is dispersed in a solvent into slurry, and resulting slip is poured into a mold made of plaster or the like, released from the mold, dried and then fired to obtain a fired body. In the powder injection molding method, production is performed as follows. First, ceramics powder and an organic binder composed of a thermoplastic resin are mixed to create a composition for injection molding, which is injected to fill a mold having a cavity in the shape of a desired article to obtain a molding. Then, the molding is heated up to the order of about 400° C. to 500° C. in an atmospheric air or an inert atmosphere for degreasing, thereby removing the organic binder. Subsequently, the resulting molding is subjected to firing in the atmospheric air at a predetermined temperature, resulting in a fired body.

Then, the fired body obtained by either of the above methods is subjected to machining such as grinding of details and polishing of the surface into a desired shape of a decorative article of wristwatch, whereby the insulating decorative base material 52 made of ceramics can be produced.

Next, the hard layer 3 or the hard layer 13 is formed on the surface of the obtained insulating decorative base material 52 according to the following procedure. The insulating decorative base material 52 and an alloy target are first disposed inside the above-described vacuum apparatus, and after the vacuum apparatus is evacuated, an inert gas (for example, Ar gas) is introduced therein, an internal pressure is maintained in the order of $3 \times 10^{-3}$ Torr (about 0.4 Pa), and an inert gas plasma (for example, Ar gas plasma) is caused to occur. In the inert gas plasma atmosphere, a hard layer is formed on the surface of the insulating decorative base material 52 by a sputtering method using an alloy target (for example, an alloy target having a composition of Zr: 20 wt % and Mo: 80 wt %). Here, the use of a Zr—Mo alloy for the alloy target results in the wristwatch case 31 and the case back 33 having the hard layer 3 formed on the surface thereof, and the use of a Zr—Mo additive element results in the wristwatch case 31 and the case back 33 having the hard layer 13 formed on the surface thereof. The film thickness of the hard layers 3 and 13 can be arbitrarily controlled, for example, by changing the period of the sputtering.

In the formation of the hard layer conducted by the sputtering method, the temperature of the insulating decorative base material 52 during the film formation remains at about 100° C. to about 150° C., so that the hard layer can be formed at a relatively low temperature. Consequently, when the insulating decorative base material 52 is produced of resin, the hard layer in particular is preferably formed by the sputtering method. Further, the formation of the hard layer conducted by the sputtering method can not only facilitate the composition control of the hard layer but also improve the adhesion of the hard layer as compared with that produced by coating or deposition.

2) First Examples of the Decorative Article of Wristwatch

Concrete examples (samples) of the above-described wristwatch case 31 and case back 33 were produced. Those examples are described with reference to Table 9. The wristwatch cases 31 and case backs 33 were produced using an insulating decorative base material 52 composed of a thermoplastic resin having a composition of 6-nylon: 80 wt %, glass fiber with 10 μm in diameter of fiber: 13 wt %, and $CaSiO_3$: 7 wt %. As the alloy target, several kinds of Zr—Mo alloys and Zr—Mo additive element alloys were prepared respectively by appropriately changing the composition of the respective metals. Each of the alloy targets was used to form the hard layer on the surface of the insulating decorative base material 52, thereby producing the wristwatch cases 31 and case backs 33. The hard layers 3 5 formed using the Zr—Mo alloys for the alloy target result in examples 401 to 408, and the hard layers 13 formed using the Zr—Mo additive element alloys for the alloy target results in examples 409 to 441. In each of the examples, the film thickness of the hard layer is set at about 1 μm.

Then, to check the characteristics of the resulting wristwatch case 31 and back 33, the radio controlled wristwatch 30 shown in FIG. 21 was produced using the wristwatch case 31 and case back 33 and subjected to an evaluation on four items, that is, "amount of decrease in reception sensitivity," "abrasion resistance," "hardness," and "quality of external appearance" according to the following procedure.

As described above, the reception sensitivity of time radio wave of the antenna 37 is the important element to determine the performance of the radio-controlled wristwatch 30, and therefore it is necessary to minimize the influence exerted by the wristwatch case 31 and case back 33 on the radio wave reception sensitivity of the antenna 37. Hence, the "amount of decrease in reception sensitivity" was measured for evaluation according to the following procedure.

The measurement of the amount of decrease in the reception sensitivity is conducted by incorporating the movement 36 in the sealed space formed using the wristwatch case 31 and case back 33 and measuring the electric field intensity at reception limit with respect to a radio wave of 40 kHz in a shielded room that is shielded from an external radio wave. To check the influence of the hard layer on the reception characteristics, the measurement value when the movement 36 was incorporated and the measurement value of not incorporated movement 36 which had been measured in advance were compared to find the amount of decrease in the reception sensitivity. A case where the amount of decrease in the radio wave reception sensitivity was less than 1 decibel (dB) was regarded here as having no problem as the reception performance of the radio controlled wristwatch and thus evaluated as acceptable.

As the "abrasion resistance," an abrasion test was conducted by scrubbing the surface of the wristwatch case 31 and case back 33 using a sand eraser, and a case where the base of the wristwatch case 31 and case back 33 was still invisible after 30 times reciprocations of the sand eraser with a load of 2 kg was determined as acceptable. Since these two items are important as the performance of the radio-controlled wristwatch 30, the wristwatch case 31 and case back 33 evaluated as acceptable on both items were determined as acceptable in overall evaluation.

Besides, as for the "hardness," the Vickers hardness was measured under the condition of a load of 1 gf. It is preferable that the Vickers hardness is Hv=600 or more. Further, as for the "quality of external appearance," the surface roughness states of the respective external appearances of the wristwatch case 31 and case back 33 were observed for evaluation. The results of performance of the above evaluations are as shown in Table 9.

As shown in Table 9, the amount of decrease in the radio wave reception sensitivity remained at 0.1 decibel in each example, and there was no problem found at all in the reception performance. Further, after the abrasion test, no peeling of the hard layer was recognized. Consequently, the respective examples were acceptable in overall evaluation.

The evaluation results of the Vickers hardness and the surface roughness state of the external appearance are as follows.

A) The Case of Using a Zr—Mo Alloy (Examples 401 to 408)

In this case, the Vickers hardness was Hv=600 or more except for the example 408. Besides, as for the surface roughness state of the external appearance, a slight surface roughness was recognized in the example 401 in which crystalline $Mo_2Zr$ was formed, but the other examples had good states. The example 408 has a Mo content of 25 wt %, while the example 401 has a Mo content of 80 wt %. Accordingly, for good evaluations both in the Vickers hardness and the surface roughness state of the external appearance, the Mo content is acceptably more than 25 wt % and less than 80 wt %, and the Mo content is preferably about 30 to 75 wt %. The Mo content within this range can provide a decorative article of wristwatch that is excellent in abrasion resistance owing to a higher hardness and in surface smoothness presenting a beautiful external appearance and a metallic external appearance with a high-class feeling.

B) The Case of Using a Zr—Mo Additive Element Alloy (Examples 409 to 441)

In this case, the Vickers hardness was Hv=600 or more except for the examples 423, 432, and 441. Besides, as for the surface roughness state of the external appearance, a slight surface roughness was recognized in the examples 409, 410, 424, 425, 433, and 434 in which crystalline $Mo_2Zr$ was formed, but the other examples had good states. The examples 423, 432, and 441 have a Mo content of 20 wt %, while the other examples have a Mo content of more than 20 wt %.

On the other hand, the examples 410, 425, and 434 have a Mo content of 70 wt %, while the other examples have a Mo content of less than 70 wt %. The examples 409, 424, and 433 have a content of additive element (Nb, Ta, and Ti, respectively) of 26 wt %, while the other examples have a content of additive element of less than 26 wt %.

From those results, for a good evaluation in the Vickers hardness, the Mo content is acceptably more than 20 wt %, and the Mo content is preferably about 25 wt % or more. Further, for good evaluations in the surface roughness state of the external appearance as well as the Vickers hardness, it is acceptable that the Mo content is less than 70 wt % and the content of additive element is less than 26 wt %, and it is preferable that the Mo content is about 65 wt % or less and the content of additive element is about 25 wt % or less.

3) Second Examples of the Decorative Article of Wristwatch

In this example, the wristwatch cases 31 and case backs 33 were produced using an insulating decorative base material 52 different in material from that of the first examples. The insulating decorative base material 52 was formed using zirconia being ceramics, which was molded by the powder injection method. The insulating decorative base material 52 is produced in the following manner in detail. First, powder containing zirconia as a major constituent and an organic binder composed of a mix of polypropylene, polystyrene, ethylene-vinyl acetate, polybutyl methacrylate, and wax are mixed and kneaded into a molding material, and this molding material is used to produce insulating moldings for the wristwatch case and case back. Then, after the insulating molding is subjected to rough machining such as deburring or the like by machining, the molding is slowly, taking about 72 hours, increased in temperature to about 500° C. in an atmospheric air for degreasing, thereby removing the organic binder, and is further fired at about 1450° C. in the atmospheric air for about three hours, thereby obtaining a fired body. Subsequently, the fired body is subjected to machining such as grinding of details and polishing of the surface, whereby the insulating decorative base material 52 made of zirconea ceramics can be produced.

In this example, the wristwatch cases 31 and case backs 33 were produced with the film thickness of the hard layer appropriately changed within a range from 0.3 μm to 1.2 μm according to the same procedure as that in the first example though a different material is used for the insulating decorative base material 52. Each example was evaluated on the same items as those of the first examples. Further, as comparative examples, a metal film made of gold (Au) or nickel (Ni) in place of the hard layer was formed on the surface of the insulating decorative base material 52 by the sputtering method to produce wristwatch cases and case backs, with which radio-controlled wristwatches were produced and evaluated on the same items as those of the first examples. The results of these evaluations are as shown in Table 12.

As shown in Table 12, the amount of decrease in the radio wave reception sensitivity remained at 0.1 decibel in each example, and there was no problem found at all in the reception performance. Further, after the abrasion test, no peeling of the hard layer was recognized. Consequently, the respective examples were acceptable in overall evaluation. Besides, the respective examples had a Vickers hardness Hv=600 or more.

As shown in this example, the wristwatch case 31 and case back 33 do not decrease the radio wave reception sensitivity even if the film thickness of the hard layer is increased, and there is no problem found at all in the radio wave reception performance. This applies to the abrasion resistance. Accordingly, even when the hard layer is formed in any film thickness, the abrasion resistance can be improved without decrease in the radio wave reception sensitivity.

On the other hand, in comparative examples 407 to 414, since the amount of decrease in the radio wave reception sensitivity reaches 2.1 decibel (comparative example 407) even at the lowest, that is, more than 1 decibel, there is a great decrease in the reception performance. Further, after the abrasion test, no peeling of the metal film was recognized in the comparative examples 408 to 410 and 412 to 414, but peeling of the metal film was found in the comparative examples 407 and 411. It is considered that this results from insufficient abrasion resistance because the film thickness of the metal film is as small as 0.3 μm in the case of the comparative examples 407 and 411. From the above results, the comparative example 407 to the comparative example 414 were unacceptable in overall evaluation. Besides, as for the hardness, the comparative examples had a low value as compared with examples 454 to 461, failing to obtain sufficient hardness.

As shown in the comparative example 407 to the comparative example 410 and the comparative example 411 to the comparative example 414, when the metal film of Au or Ni is formed, the radio wave reception sensitivity decreases with an increase in the film thickness. Therefore, to restrain the decrease in the radio wave reception sensitivity to avoid radio wave reception fault, the metal film needs to be formed thin (for example, less than 0.3 μm). However, the metal film that is formed thin to have a thickness of less than 0.3 μm is insufficient in abrasion resistance and thus lack of durability, which may cause trouble in using the decorative article of wristwatch.

4) Third Example of the Decorative Article of Wristwatch

Conditions for the hard layer to be in the amorphous phase examined on the above-described wristwatch case 31 and case back 33 according to the same procedure as that of the first embodiment were as follows.

In the case of using a Zr—Mo alloy, when the Mo content is about 30 to 60 wt %, the hard layer is in the amorphous phase. Meanwhile, in the case of using a Zr—Mo additive element alloy, when the total content of Mo and additive elements is about 30 to 55 wt %, the hard layer is in the amorphous phase. In these cases, the surface of the decorative article of wristwatch are made smooth and thus insusceptible to a fingerprint left thereon, and can make them better in decorativeness of the external appearance to provide a high-class feeling. Especially, the decorative article of wristwatch becomes preferable for a radio-controlled wristwatch.

Fourth Embodiment

Figure 17:
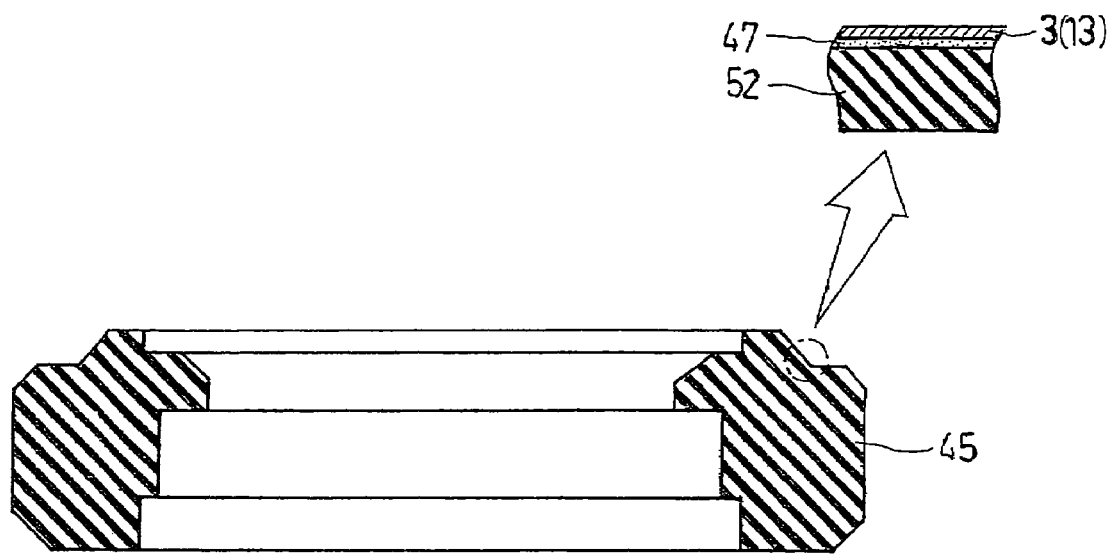
FIG. 17 is a schematic sectional view showing another wristwatch case using an insulating decorative base material and an enlarged principal part thereof.
Figure 18:
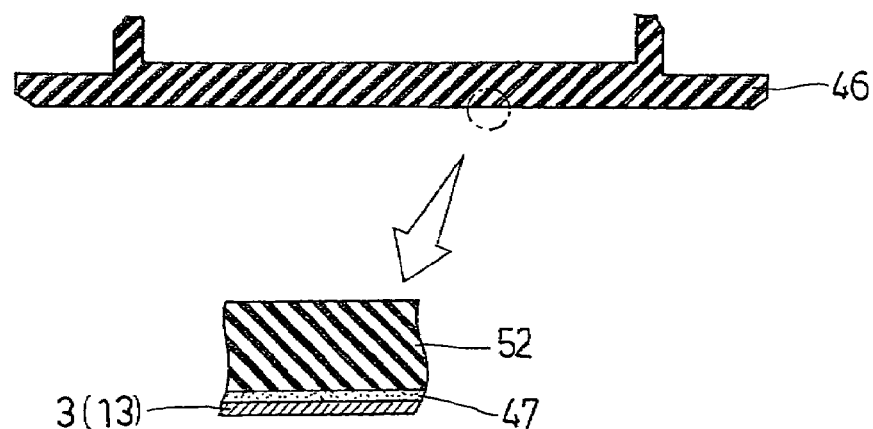
FIG. 18 is a schematic sectional view showing another case back using an insulating decorative base material and an enlarged principal part thereof.

1) A Structure of a Decorative Article of Wristwatch and a Method of Producing the Same FIG. 17 is an enlarged partial sectional view showing the principal part of a wristwatch case 45 being an example of the decorative article of wristwatch according to the invention. FIG. 18 is a similar enlarged partial sectional view showing the principal part of a case back 46. Both the wristwatch case 45 and the case back 46 have an intermediate layer 47 on the entire outer surface of an insulating decorative base material 52 and have a hard layer 3 through the intermediate layer 47, the hard layer 3 being a metal film containing Zr and Mo as in the above-described third embodiment. In place of the hard layer 3, a hard layer 13 may be formed.

In short, the wristwatch case 45 and case back 46 have configurations that are different from those of the above-described wristwatch case 31 and case back 33 in that the respective hard layers 3 or 13 are formed through the intermediate layers 47, and are the same in other points.

The intermediate layer 47 is preferably made of a urethane resin, aminoacrylic resin, or the like, and its film thickness is preferably in the order of about 10 μm to about 30 μm. This is because, with a film thickness of less than 10 μm, the base that is the surface of the insulating decorative base material 52 is difficult to be sufficiently smoothed, and with more than 30 μm, the quality of external appearance may deteriorate due to heat and stress generated when the hard layer is formed.

The wristwatch case 45 and case back 46 are produced in the following manner.

The insulating decorative base material 52 is produced according to the same procedure as that of the third embodiment. Then, paint containing resin necessary to form the intermediate layer 47 is applied onto the surface of the insulating decorative base material 52 by spraying or dipping and hardened by heat or irradiation of ultraviolet rays, thereby forming the intermediate layer 47. Then, through the intermediate layer 47, the hard layer 3 (hard layer 13) is formed on the surface of the insulating decorative base material 52 according to the same procedure as that of the third embodiment, resulting in the wristwatch case 45 and case back 46.

Owing to provision of the intermediate layer 47, the wristwatch case 45 and case back 46 decrease in the surface roughness of the external appearance to have better mirror surface property and can obtain a metallic external appearance in a mirror finished condition. It can be considered that this is because the surface roughness of the insulating decorative base material 52 caused by flaws of the mold or the enhancing substance such as glass fiber or the like contained in the thermoplastic resin being the material of the insulating decorative base material 52 was covered with the intermediate layer 47, so that the surface of the insulating decorative base material 52 was smoothed.

2) First Examples of the Decorative article of Wristwatch

Concrete examples (samples) of the above-described wristwatch case 45 and case back 46 were produced. Those examples are described with reference to Table 10 and Table 11.

The wristwatch cases 45 and case backs 46 were produced using the insulating decorative base material 52 the same as that of the third embodiment. As the alloy target, several kinds of Zr—Mo alloys and Zr—Mo additive element alloys were prepared respectively by appropriately changing the composition of the respective metals. Each of the alloy targets was used to form the intermediate layer 47 on the surface of the insulating decorative base material 52 according to the following procedure, and a hard layer having a film thickness in the order of about 1 μm is formed through the intermediate layer 47, thereby producing the wristwatch cases 45 and case backs 46. Then, the resulting wristwatch cases 45 and case backs 46 were evaluated on the same items as those in the third embodiment. The results of the evaluations are as shown in Table 10.

The intermediate layer 47 is formed here in the following manner. First, the produced insulating decorative base material 52 is washed and dried, and then coated with paint containing a urethane resin by spray coating. Thereafter, the insulating decorative base material 52 is subjected to a hardening treatment through heating at a temperature of about 120° C. for about 90 minutes, thereby forming the intermediate layer 47. The film thickness of the intermediate layer 47 is about 15 μm.

Further, as comparative examples, a metal film was formed on the surface of the insulating decorative base material 52, in stead of forming the hard layer, to produce wristwatch cases and case backs, with which radio-controlled wristwatches were produced and evaluated on the same items as those of the third embodiment. The results of the evaluations are as shown in Table 11. It should be noted that metal comprising at least one selected from gold (Au), nickel (Ni), phosphorus (P), iron (Fe), chromium (Cr), platinum (Pt), and aluminum (Al) was used as the material of the metal film. In comparative examples 401 to 404 shown in Table 11, the metal film was formed by sputtering. The metal film was formed by electroplating in a comparative example 405 and by deposition in a comparative example 406.

As shown in Table 10, the amount of decrease in the radio wave reception sensitivity remained at 0.1 decibel in each example, and there was no problem found at all in the reception performance. Further, after the abrasion test, no peeling of the hard layer was recognized. Consequently, the respective examples were acceptable in overall evaluation.

The evaluation results of the Vickers hardness and surface roughness state are as follows.

The Vickers hardness was Hv=600 or more except for an example 453. Besides, as for the surface roughness state of the external appearance, a slight surface roughness was recognized in an example 448 in which crystalline Mo$_2$Zr was formed, but the other examples had good states. The example 453 has a Mo content of 5 wt % and a total content of additive elements of 15 wt %. Further, the example 448 has a Mo content of 70 wt % and a total content of additive elements of 15 wt %.

The wristwatch case 45 and case back 46 have configurations that are different from those of the wristwatch case 31 and case back 33 only in that the respective hard layers 3 or 13 are formed through the intermediate layers 47, and are the same in other points, and therefore it is considered that conditions for good Vickers hardness and conditions for good evaluations in the quality of external appearance as well as the Vickers hardness are the same as those shown in the first example of the third embodiment. More specifically, to improve the Vickers hardness, the Mo content is acceptably more than 20 wt %, and the Mo content is preferably about 25 wt % or more. Further, for good evaluations in the surface roughness state of the external appearance as well as the Vickers hardness, it is acceptable that the Mo content is less than 70 wt % and the total content of additive elements is less than 26 wt %, and it is preferable that the Mo content is about 65 wt % or less and the total content of additive elements is about 25 wt % or less. However, the content of the additive elements in this case is the total content of at least two selected from Nb, Ta, and Ti. The respective examples shown in Table 10 except the examples 448 and 453 satisfy these conditions.

On the other hand, as shown in Table 11, in the comparative example 401 to the comparative example 406, since the amount of decrease in the radio wave reception sensitivity reaches 1.3 decibel (comparative example 404) even at the lowest, that is, more than 1 decibel, there is a great decrease in the reception performance. Further, after the abrasion test, no peeling of the metal film was recognized in the comparative examples 401 to 404, but peeling of the metal film was found in the comparative examples 405 and 406. It is considered that this is because the metal film does not have sufficient adhesion because the metal film was formed by plating or deposition in the case of the comparative examples 405 and 406. From the above results, the comparative example 401 to the comparative example 406 were unacceptable in overall evaluation. Besides, as for the hardness, the comparative examples had a low value as compared with the examples shown in Table 10, failing to obtain sufficient hardness.

3) Second Examples of the Decorative Article of Wristwatch

Conditions for the hard layer to be in the amorphous phase examined on the above-described wristwatch case 45 and case back 46 according to the same procedure as that of the first embodiment were as follows.

In the case of using a Zr—Mo alloy, when the Mo content is about 30 to 60 wt %, the hard layer is in the amorphous phase. Meanwhile, in the case of using a Zr—Mo additive element alloy, when the total content of Mo and additive elements is about 30 to 55 wt %, the hard layer is in the amorphous phase. In these cases, the surface of the soft metal and decorative article of wristwatch are made smooth and thus insusceptible to a fingerprint left thereon, and can make them better in decorativeness of the external appearance to provide a high-class feeling. Especially, the decorative article of wristwatch becomes preferable for a radio-controlled wristwatch.

Fifth Embodiment

Figure 19:
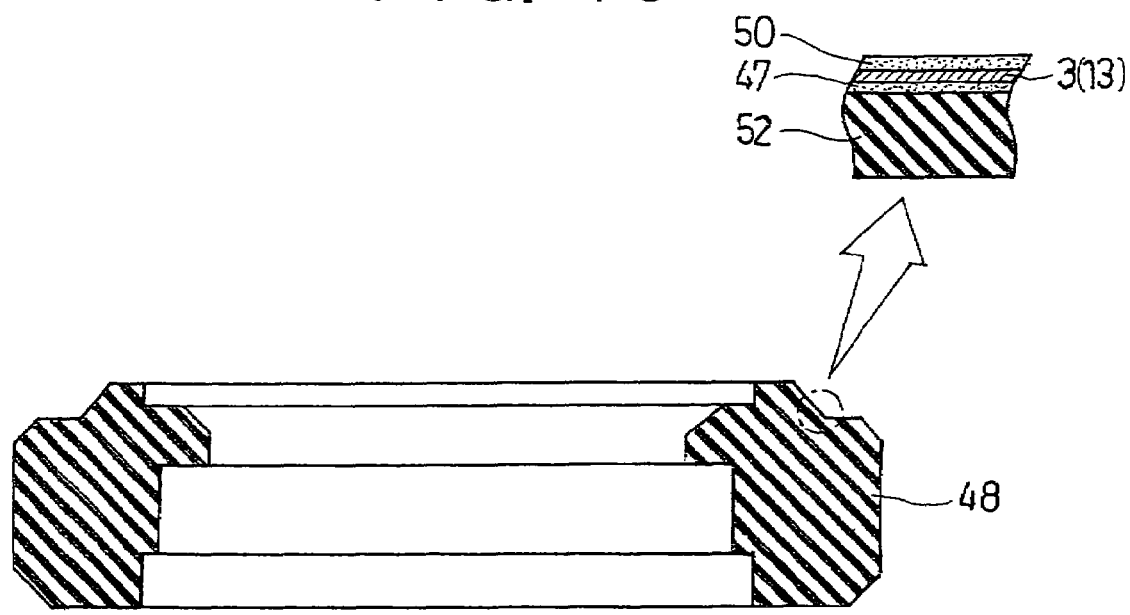
FIG. 19 is a schematic sectional view showing still another wristwatch case using an insulating decorative base material and an enlarged principal part thereof.
Figure 20:
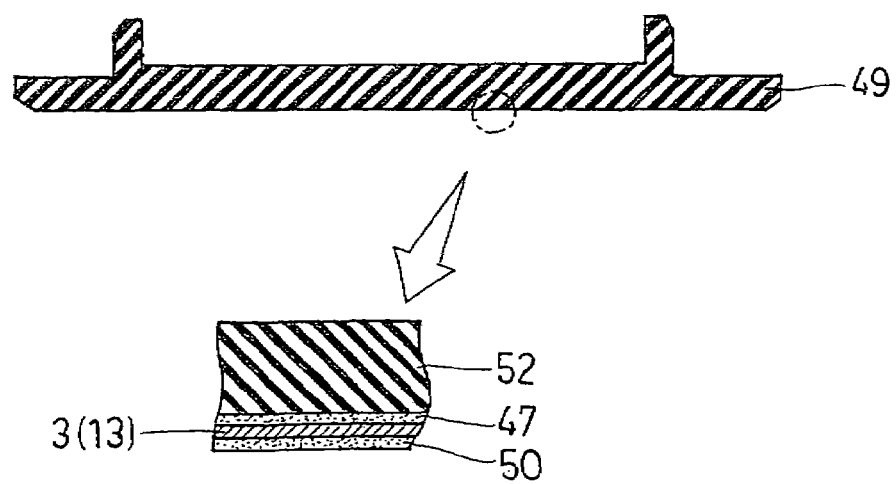
FIG. 20 is a schematic sectional view showing still another case back using an insulating decorative base material and an enlarged principal part thereof.

1) A Structure of a Decorative Article of Wristwatch and a Method of Producing the Same FIG. 19 is an enlarged partial sectional view showing the principal part of a wristwatch case 48 being an example of the decorative article of wristwatch according to the invention. FIG. 20 is a similar enlarged partial sectional view showing the principal part of a case back 49. Both the wristwatch case 48 and the case back 49 have a hard layer 3 through an intermediate layer 47 on the entire outer surface of an insulating decorative base material 52, and have a protective film 50 made of a transparent resin formed on the entire surface of the hard layer 3, the hard layer 3 being a metal film containing Zr and Mo as in the above-described third embodiment. In place of the hard layer 3, a hard layer 13 may be formed, and it is also adoptable to form the hard layer 3 or the hard layer 13 not through the intermediate layer 47 and to form the protective film 50 on the entire surface thereof.

In short, the wristwatch case 48 and case back 49 have configurations that are different form those of the above-described wristwatch case 45 and case back 46 in that the protective films 50 are formed on the respective hard layers 3 or 13, and the same in other points.

The protective film 50 is formed of resin, and is preferably formed of an optically transparent resin to take full advantage of the metallic color of the hard layer 3 (hard layer 13) to be formed on the base thereof and preferably formed of resin excellent in corrosion resistance and chemical resistance as well as abrasion resistance. Specifically, it is preferable to use resin such as a urethane resin, acrylic resin, silicone resin, fluoric resin, or the like. Further, it is adoptable to color the protective film 50 by adding a pigment or the like to its material (for example, paint).

The film thickness of the protective film 50 is preferably in the order of about 5 μm to about 30 μm. This is because, with a film thickness of less than 5 μm, the protective film 50 is insufficient in abrasion resistance, and with a film thickness of more than 30 μm, the protective film lacks in smoothness to lead to a deterioration in the quality of external appearance of the wristwatch case 48 and case back 49.

The formation of the protective film on the surface of the hard layer 3 or 13 can improve the abrasion resistance of the wristwatch case 48 and case back 49. It is preferable to form the protective film 50 particularly when the film thickness of the hard layer 3 or 13 is small, for example, 0.3 μm or less. The formation of the protective film 50 can improve the abrasion resistance of the wristwatch case 48 and case back 49.

The wristwatch case 48 and case back 49 are produced as in the following manner.

The insulating decorative base material 52 made of resin or ceramics is produced according to the same procedure as that of the third embodiment. For this insulating decorative base material 52, the hard layer 3 or 13 is formed according to the same procedure as that of the third embodiment. In this event, the hard layer 3 or 13 is formed through the intermediate layer 47, but may be formed not through the intermediate layer 47. The film thickness of the hard layers 3 and 13 is preferably in the order of about 0.05 μm to about 0.3 μm. The film thickness of less than about 0.05 μm is not preferable because sufficient metallic external appearance cannot be obtained. When paint being a material of the protective film 50 is applied to the surface of the hard layer 3 or 13 by spraying or dipping and hardened by heat or irradiation of ultraviolet rays, the protective film 50 is formed, resulting in the wristwatch case 48 and case back 49.

2) Examples of the Decorative Article of Wristwatch

Concrete examples (samples) of the above-described wristwatch case 48 and case back 49 were produced. Those examples are described with reference to Table 13.

The wristwatch cases 48 and case backs 49 were produced using the same thermoplastic resin as that of the third embodiment (for example, a thermoplastic resin having a composition of 6-nylon: 80 wt %, glass fiber with 10 μm in diameter of fiber: 13 wt %, and $CaSiO_3$: 7 wt %). Then, the insulating decorative base material 52 is formed according to the same procedure as that of the third embodiment. To the surface of the insulating decorative base material 52, paint containing a urethane resin is applied by spray coating and subjected to a hardening treatment through heating at a temperature of about 120° C. for about 90 minutes, thereby forming the intermediate layer 47 (having a film thickness of about 15 μm). Through the intermediate layer 47, the hard layer 13 was formed, thereby producing the wristwatch cases 48 and case backs 49. The intermediate layer 47 is formed to have here a film thickness of 15 μm, and the hard layer 13 is formed to have a film thickness of 0.1 μm. Further, three different protective films 50 were formed on the surface of the hard layers 13.

First of all, paint containing an acrylic resin was applied by spray coating and then left standing at room temperature for about 24 hours, thereby forming a protective film 50 having a film thickness of 25 μm (example 462). Further, paint containing a urethane resin was applied by spray coating and then dried at about 70° C. for about 90 minutes, thereby forming a protective film 50 having a film thickness of 20 μm (example 463). Furthermore, ultraviolet curing paint containing a silicone resin was applied by spray coating and subjected to a hardening treatment by irradiating with ultraviolet rays having a wavelength of 365 nm, thereby forming a protective, film 50 having a film thickness of 10 μm (example 464).

Further, the wristwatch case and case back were produced (comparative examples 415 and 416) according to the same procedure as that of the example 462 except that the film thickness of the protective film was changed (3 μm and 40 μm). Furthermore, the wristwatch case and case back were produced (comparative example 417) according to the same procedure as that of the example 463 except that the film thickness of the hard layer was changed (0.03 μm).

Then, the resulting wristwatch cases and case backs were evaluated on the above-described items as those of the third embodiment except the hardness. The evaluation results are as shown in Table 13.

As shown in Table 13, the amount of decrease in the radio wave reception sensitivity remained at 0.05 decibel in each example, and there was no problem found at all in the reception performance. Further, even though the film thickness of the hard layer is as small as 0.1 μm, no peeling of the hard layer was recognized also after the abrasion test, so that abrasion resistance thereof was good. This is because the surface of the hard layer 13 is protected by the protective film 50.

On the other hand, in the comparative example 415 and the comparative example 416, the amount of decrease in the radio wave reception sensitivity remained at 0.05 decibel, and there was no problem found at all in the reception performance. However, in the comparative example 415, peeling of the hard layer after the abrasion test was recognized, resulting in poor abrasion resistance. It is considered that this results from insufficient abrasion resistance of the protective film 50 because the film thickness of the protective film 50 is as small as 3 μm. Besides, the comparative example 416 was good in abrasion resistance but poor in quality of external appearance due to lack of smoothness because the film thickness of the protective film is as large as 40 μm. In addition, the comparative example 417 was good in abrasion resistance but poor in quality of external appearance due to lack of excellent metallic color because the film thickness of the hard layer is as small as 0.03 μm.

It should be noted that it is suitable to introduce Ar gas as the inert gas introduced into the vacuum apparatus to cause an inert gas plasma to occur in the above-described embodiments, and it is also adoptable to introduce He (helium), Ne (neon), Xe (xenon), or Kr (krypton) in place of the Ar gas. The pressure at which the inert gas is introduced into the vacuum apparatus only needs to be a pressure capable of causing an inert gas plasma to occur, and thus is not limited to the order of $3 \times 10^{-3}$ Torr (about 0.4 Pa).

Further, it is possible to apply, as the sputtering, for example, RF sputtering, DC sputtering, RF magnetron sputtering, DC magnetron sputtering, and so on.

TABLE 1

| | Material of soft metal | Soft metal article Decorative article of wristwatch | Composition of hard layer (wt %) | | Hardness (Hv) | Surface roughness Average surface roughness Ra (μm) | Adhesion property Peeling starting load (gf) | Corrosion resistance Corrosion | Overall evaluation |
|---|---|---|---|---|---|---|---|---|---|
| | | | Zr | Mo | | | | | |
| Example 1 | SUS316L | flat plate | 25 | 75 | 950 | 0.35 | 750 | no | acceptable |
| Example 2 | SUS316L | flat plate | 30 | 70 | 930 | 0.3 | 750 | no | acceptable |
| Example 3 | SUS316L | wristwatch bezel | 40 | 60 | 800 | 0.2 | 650 | no | acceptable |
| Example 4 | Ti | wristwatch bezel | 50 | 50 | 730 | 0.1 | 600 | no | acceptable |
| Example 5 | Ti | flat plate | 60 | 40 | 680 | 0.1 | 550 | no | acceptable |
| Example 6 | Ti | flat plate | 70 | 30 | 650 | 0.1 | 500 | no | acceptable |
| Example 7 | Ti | wristwatch band | 25 | 75 | 940 | 0.35 | 750 | no | acceptable |
| Example 8 | Ti | wristwatch case | 30 | 70 | 920 | 0.3 | 750 | no | acceptable |
| Example 9 | Ti | wristwatch case back | 40 | 60 | 780 | 0.15 | 650 | no | acceptable |
| Example 10 | SUS316L | wristwatch band | 50 | 50 | 740 | 0.1 | 600 | no | acceptable |
| Example 11 | SUS316L | wristwatch case | 60 | 40 | 700 | 0.1 | 600 | no | acceptable |
| Example 12 | SUS316L | wristwatch case back | 70 | 30 | 650 | 0.1 | 500 | no | acceptable |
| | | | plating film | | | | | | |
| C/P ex. 1 | SUS316L | flat plate | Ni—P plating | | 320 | 0.1 | 300 | no | unacceptable |
| C/P ex. 2 | Ti | flat plate | Ni—P plating | | 300 | 0.1 | 300 | no | unacceptable |
| C/P ex. 3 | SUS316L | wristwatch band | Ni—P plating | | 360 | 0.1 | 350 | no | unacceptable |
| C/P ex. 4 | Ti | wristwatch band | Ni—P plating | | 350 | 0.1 | 300 | no | unacceptable |

*C/P ex. = comparative example

TABLE 2

| | Material of soft metal | Soft metal article Decorative article of wristwatch | Composition of hard layer (wt %) | | | | | Hardness (Hv) | Surface roughness Average surface roughness Ra (μm) | Adhesion property Peeling starting load (gf) | Corrosion resistance Corrosion | Overall evaluation |
|---|---|---|---|---|---|---|---|---|---|---|---|---|
| | | | Zr | Mo | Nb | Ta | Ti | | | | | |
| Example 13 | Ti | flat plate | 20 | 65 | 15 | | | 900 | 0.3 | 750 | no | acceptable |
| Example 14 | Ti | flat plate | 25 | 60 | 15 | | | 920 | 0.3 | 750 | no | acceptable |
| Example 15 | brass | flat plate | 45 | 50 | 5 | | | 740 | 0.1 | 600 | no | acceptable |
| Example 16 | brass | flat plate | 40 | 50 | 10 | | | 770 | 0.15 | 650 | no | acceptable |
| Example 17 | SUS304 | flat plate | 50 | 49 | 1 | | | 730 | 0.1 | 600 | no | acceptable |
| Example 18 | SUS304 | flat plate | 50 | 47 | 3 | | | 720 | 0.1 | 600 | no | acceptable |
| Example 19 | Ti | wristwatch case | 55 | 40 | 5 | | | 700 | 0.1 | 600 | no | acceptable |
| Example 20 | Ti | wristwatch bezel | 50 | 40 | 10 | | | 740 | 0.1 | 600 | no | acceptable |
| Example 21 | brass | wristwatch case | 40 | 40 | 20 | | | 730 | 0.1 | 600 | no | acceptable |
| Example 22 | brass | wristwatch band | 50 | 30 | 20 | | | 660 | 0.1 | 550 | no | acceptable |
| Example 23 | SUS304 | wristwatch case | 70 | 25 | 5 | | | 640 | 0.1 | 500 | no | acceptable |
| Example 24 | SUS304 | wristwatch band | 50 | 25 | 25 | | | 670 | 0.1 | 550 | no | acceptable |
| Example 25 | Ti | wristwatch case | 20 | 65 | | 15 | | 940 | 0.35 | 750 | no | acceptable |
| Example 26 | Ti | wristwatch band | 45 | 50 | | 5 | | 800 | 0.2 | 700 | no | acceptable |
| Example 27 | brass | wristwatch case | 50 | 49 | | 1 | | 720 | 0.1 | 600 | no | acceptable |
| Example 28 | brass | wristwatch band | 55 | 40 | | 5 | | 710 | 0.1 | 600 | no | acceptable |
| Example 29 | SUS304 | wristwatch bezel | 40 | 40 | | 20 | | 740 | 0.1 | 600 | no | acceptable |
| Example 30 | SUS304 | wristwatch band | 70 | 25 | | 5 | | 630 | 0.1 | 500 | no | acceptable |
| Example 31 | SUS304 | wristwatch case back | 25 | 60 | | | 15 | 920 | 0.3 | 750 | no | acceptable |
| Example 32 | SUS304 | clasp | 40 | 50 | | | 10 | 750 | 0.15 | 600 | no | acceptable |
| Example 33 | Ti | flat plate | 50 | 47 | | | 3 | 710 | 0.1 | 600 | no | acceptable |
| Example 34 | Ti | clasp | 50 | 40 | | | 10 | 790 | 0.15 | 650 | no | acceptable |
| Example 35 | brass | wristwatch case back | 50 | 30 | | | 20 | 650 | 0.1 | 500 | no | acceptable |
| Example 36 | brass | flat plate | 50 | 25 | | | 25 | 630 | 0.1 | 500 | no | acceptable |
| Example 37 | brass | wristwatch case | 25 | 60 | 10 | 5 | | 920 | 0.3 | 750 | no | acceptable |
| Example 38 | brass | wristwatch band | 50 | 40 | 5 | 5 | | 690 | 0.1 | 550 | no | acceptable |
| Example 39 | SUS304 | wristwatch case | 45 | 50 | 2 | | 3 | 800 | 0.2 | 700 | no | acceptable |
| Example 40 | SUS304 | wristwatch band | 40 | 50 | 5 | | 5 | 780 | 0.15 | 650 | no | acceptable |
| Example 41 | SUS304 | flat plate | 40 | 50 | | 5 | 5 | 770 | 0.15 | 650 | no | acceptable |
| Example 42 | SUS304 | wristwatch band | 40 | 40 | | 10 | 10 | 750 | 0.15 | 600 | no | acceptable |
| Example 43 | Ti | wristwatch case | 50 | 47 | 1 | 1 | 1 | 740 | 0.1 | 600 | no | acceptable |
| Example 44 | Ti | wristwatch band | 40 | 40 | 10 | 5 | 5 | 700 | 0.1 | 600 | no | acceptable |
| Example 45 | Ti | wristwatch case back | 40 | 40 | 5 | 10 | 5 | 680 | 0.1 | 550 | no | acceptable |
| Example 46 | Ti | clasp | 40 | 40 | 5 | 5 | 10 | 680 | 0.1 | 550 | no | acceptable |

TABLE 3

| | Material of soft metal | Soft metal article Decorative article of wristwatch | Composition of hard layer (wt %) | | | | | Hardness (Hv) | Surface roughness Average surface roughness Ra (μm) | Adhesion property Peeling starting load (gf) | Corrosion resistance Corrosion | Overall evaluation |
|---|---|---|---|---|---|---|---|---|---|---|---|---|
| | | | Zr | Mo | Nb | Ta | Ti | | | | | |
| Example 51 | Al | flat plate | 25 | 75 | | | | 940 | 0.35 | 750 | no | acceptable |
| Example 52 | brass | flat plate | 25 | 75 | | | | 960 | 0.35 | 800 | no | acceptable |
| Example 53 | SUS304 | flat plate | 25 | 75 | | | | 950 | 0.35 | 750 | no | acceptable |
| Example 54 | Al | wristwatch case | 70 | 30 | | | | 630 | 0.1 | 500 | no | acceptable |
| Example 55 | brass | wristwatch case | 70 | 30 | | | | 620 | 0.1 | 500 | no | acceptable |
| Example 56 | SUS304 | wristwatch case | 70 | 30 | | | | 640 | 0.1 | 500 | no | acceptable |
| Example 57 | SUS316L | flat plate | 20 | 65 | 15 | | | 940 | 0.35 | 750 | no | acceptable |
| Example 58 | Ti | wristwatch case | 20 | 65 | | 15 | | 950 | 0.35 | 750 | no | acceptable |
| Example 59 | Ti | wristwatch band | 20 | 65 | | | 15 | 950 | 0.35 | 750 | no | acceptable |
| Example 60 | Ti | wristwatch case back | 20 | 65 | 5 | 5 | 5 | 960 | 0.35 | 750 | no | acceptable |
| Example 61 | Al | wristwatch case | 70 | 25 | 5 | | | 640 | 0.1 | 500 | no | acceptable |

TABLE 3-continued

| | Material of soft metal | Soft metal article Decorative article of wristwatch | Composition of hard layer (wt %) | | | | | Hardness (Hv) | Surface roughness Average surface roughness Ra (μm) | Adhesion property Peeling starting load (gf) | Corrosion resistance Corrosion | Overall evaluation |
|---|---|---|---|---|---|---|---|---|---|---|---|---|
| | | | Zr | Mo | Nb | Ta | Ti | | | | | |
| Example 62 | brass | wristwatch band | 70 | 25 | 5 | | | 630 | 0.1 | 500 | no | acceptable |
| Example 63 | SUS316L | wristwatch band | 70 | 25 | | | 5 | 630 | 0.1 | 500 | no | acceptable |
| Example 64 | Al | wristwatch case | 70 | 29 | 1 | | | 620 | 0.1 | 500 | no | acceptable |
| Example 65 | brass | wristwatch band | 70 | 29 | | 1 | | 610 | 0.1 | 500 | no | acceptable |
| Example 66 | SUS316L | wristwatch case back | 70 | 29 | | | 1 | 610 | 0.1 | 500 | no | acceptable |
| C/P ex. 5 | Al | flat plate | 24 | 76 | | | | 1040 | 0.45 | 800 | no | unacceptable |
| C/P ex. 6 | brass | flat plate | 24 | 76 | | | | 1050 | 0.45 | 850 | no | unacceptable |
| C/P ex. 7 | SUS304 | flat plate | 24 | 76 | | | | 1040 | 0.45 | 800 | no | unacceptable |
| C/P ex. 8 | Al | wristwatch case | 71 | 29 | | | | 580 | 0.1 | 450 | no | unacceptable |
| C/P ex. 9 | brass | wristwatch case | 71 | 29 | | | | 570 | 0.1 | 450 | no | unacceptable |
| C/P ex. 10 | SUS304 | wristwatch case | 71 | 29 | | | | 560 | 0.1 | 450 | no | unacceptable |
| C/P ex. 11 | SUS316L | flat plate | 19 | 66 | 15 | | | 1040 | 0.45 | 800 | no | unacceptable |
| C/P ex. 12 | Ti | wristwatch case | 19 | 66 | | 15 | | 1040 | 0.45 | 800 | no | unacceptable |
| C/P ex. 13 | Ti | wristwatch band | 19 | 66 | | | 15 | 1040 | 0.45 | 800 | no | unacceptable |
| C/P ex. 14 | Ti | wristwatch case back | 19 | 66 | 5 | 5 | 5 | 1060 | 0.45 | 850 | no | unacceptable |
| C/P ex. 15 | Al | wristwatch case | 71 | 24 | 5 | | | 580 | 0.1 | 450 | no | unacceptable |
| C/P ex. 16 | brass | wristwatch band | 71 | 24 | | 5 | | 560 | 0.1 | 450 | no | unacceptable |
| C/P ex. 17 | SUS316L | wristwatch band | 71 | 24 | | | 5 | 560 | 0.1 | 450 | no | unacceptable |
| C/P ex. 18 | Al | wristwatch case | 20 | 54 | 26 | | | 1040 | 0.45 | 800 | no | unacceptable |
| C/P ex. 19 | brass | wristwatch band | 20 | 54 | | 26 | | 1050 | 0.45 | 850 | no | unacceptable |
| C/P ex. 20 | SUS316L | wristwatch case back | 20 | 54 | | | 26 | 1040 | 0.45 | 800 | no | unacceptable |

*C/P ex. = comparative example

TABLE 4

| | Material of soft metal | Soft metal article Decorative article of wristwatch | Composition of hard layer (wt %) | | Hardness (Hv) | Surface roughness Average surface roughness Ra (μm) | Adhesion property Peeling starting load (gf) | Corrosion resistance Corrosion | Overall evaluation | Crystallinity |
|---|---|---|---|---|---|---|---|---|---|---|
| | | | Zr | Mo | | | | | | |
| Example 201 | brass | flat plate | 35 | 65 | 920 | 0.3 | 750 | no | acceptable | crystal phase |
| Example 202 | SUS304 | flat plate | 38 | 62 | 900 | 0.3 | 750 | no | acceptable | crystal phase |
| Example 203 | brass | flat plate | 40 | 60 | 800 | 0.2 | 700 | no | acceptable | amorphous phase |
| Example 204 | brass | wristwatch case | 45 | 55 | 760 | 0.15 | 650 | no | acceptable | amorphous phase |
| Example 205 | brass | wristwatch band | 50 | 50 | 730 | 0.1 | 600 | no | acceptable | amorphous phase |
| Example 206 | brass | wristwatch bezel | 55 | 45 | 700 | 0.1 | 600 | no | acceptable | amorphous phase |
| Example 207 | brass | wristwatch case back | 60 | 40 | 670 | 0.1 | 550 | no | acceptable | amorphous phase |
| Example 208 | brass | wristwatch case | 65 | 35 | 650 | 0.1 | 500 | no | acceptable | amorphous phase |
| Example 209 | brass | wristwatch bezel | 70 | 30 | 640 | 0.1 | 500 | no | acceptable | amorphous phase |
| Example 210 | SUS304 | flat plate | 40 | 60 | 820 | 0.2 | 700 | no | acceptable | amorphous phase |
| Example 211 | SUS304 | wristwatch case | 45 | 55 | 770 | 0.15 | 650 | no | acceptable | amorphous phase |
| Example 212 | SUS304 | wristwatch band | 50 | 50 | 750 | 0.1 | 600 | no | acceptable | amorphous phase |
| Example 213 | SUS304 | wristwatch bezel | 55 | 45 | 710 | 0.1 | 600 | no | acceptable | amorphous phase |
| Example 214 | SUS304 | wristwatch case back | 60 | 40 | 680 | 0.1 | 550 | no | acceptable | amorphous phase |
| Example 215 | SUS304 | wristwatch case | 65 | 35 | 660 | 0.1 | 550 | no | acceptable | amorphous phase |
| Example 216 | SUS304 | wristwatch bezel | 70 | 30 | 650 | 0.1 | 500 | no | acceptable | amorphous phase |

TABLE 5

| | Material of soft metal | Soft metal article decorative article of wristwatch | Composition of hard layer (wt %) | | | | | Hardness (Hv) | Surface roughness Average surface roughness Ra (μm) | Adhesion property Peeling starting load (gf) | Corrosion resistance Corrosion | Overall evaluation | Crystallinity |
|---|---|---|---|---|---|---|---|---|---|---|---|---|---|
| | | | Zr | Mo | Nb | Ta | Ti | | | | | | |
| Example 301 | Ti | flat plate | 35 | 40 | 25 | | | 760 | 0.15 | 650 | no | acceptable | crystal phase |
| Example 302 | SUS304 | flat plate | 40 | 45 | 15 | | | 790 | 0.15 | 650 | no | acceptable | crystal phase |
| Example 303 | SUS316L | flat plate | 43 | 56 | 1 | | | 820 | 0.2 | 700 | no | acceptable | crystal phase |
| Example 304 | Ti | wristwatch band | 45 | 30 | 25 | | | 710 | 0.1 | 600 | no | acceptable | amorphous phase |
| Example 305 | Ti | wristwatch bezel | 50 | 25 | 25 | | | 670 | 0.1 | 550 | no | acceptable | amorphous phase |
| Example 306 | Ti | wristwatch case back | 45 | 35 | 20 | | | 740 | 0.1 | 600 | no | acceptable | amorphous phase |
| Example 307 | Ti | wristwatch case | 55 | 25 | 20 | | | 670 | 0.1 | 550 | no | acceptable | amorphous phase |
| Example 308 | SUS304 | wristwatch band | 45 | 40 | 15 | | | 760 | 0.15 | 650 | no | acceptable | amorphous phase |
| Example 309 | SUS304 | wristwatch bezel | 55 | 30 | 15 | | | 720 | 0.1 | 600 | no | acceptable | amorphous phase |
| Example 310 | SUS304 | wristwatch case back | 45 | 45 | 10 | | | 790 | 0.15 | 650 | no | acceptable | amorphous phase |
| Example 311 | SUS304 | wristwatch case | 55 | 35 | 10 | | | 730 | 0.1 | 600 | no | acceptable | amorphous phase |
| Example 312 | brass | wristwatch band | 60 | 30 | 10 | | | 710 | 0.1 | 600 | no | acceptable | amorphous phase |
| Example 313 | brass | wristwatch bezel | 45 | 50 | 5 | | | 790 | 0.15 | 650 | no | acceptable | amorphous phase |
| Example 314 | brass | wristwatch case back | 50 | 45 | 5 | | | 770 | 0.15 | 650 | no | acceptable | amorphous phase |
| Example 315 | SUS316L | wristwatch band | 60 | 35 | 5 | | | 740 | 0.1 | 550 | no | acceptable | amorphous phase |
| Example 316 | SUS316L | wristwatch bezel | 70 | 25 | 5 | | | 650 | 0.1 | 500 | no | acceptable | amorphous phase |
| Example 317 | SUS316L | wristwatch case back | 45 | 54 | 1 | | | 790 | 0.15 | 650 | no | acceptable | amorphous phase |
| Example 318 | SUS316L | wristwatch case | 70 | 29 | 1 | | | 640 | 0.1 | 500 | no | acceptable | amorphous phase |
| Example 319 | Ti | wristwatch band | 45 | 30 | | 25 | | 730 | 0.1 | 600 | no | acceptable | amorphous phase |
| Example 320 | Ti | wristwatch bezel | 50 | 25 | | 25 | | 700 | 0.1 | 600 | no | acceptable | amorphous phase |
| Example 321 | Ti | wristwatch case back | 45 | 35 | | 20 | | 760 | 0.15 | 650 | no | acceptable | amorphous phase |
| Example 322 | Ti | wristwatch case | 55 | 25 | | 20 | | 700 | 0.1 | 600 | no | acceptable | amorphous phase |
| Example 323 | SUS304 | wristwatch band | 45 | 40 | | 15 | | 790 | 0.15 | 650 | no | acceptable | amorphous phase |
| Example 324 | SUS304 | wristwatch bezel | 55 | 30 | | 15 | | 740 | 0.1 | 600 | no | acceptable | amorphous phase |
| Example 325 | SUS304 | wristwatch case back | 45 | 45 | | 10 | | 820 | 0.2 | 700 | no | acceptable | amorphous phase |
| Example 326 | SUS304 | wristwatch case | 55 | 35 | | 10 | | 750 | 0.15 | 600 | no | acceptable | amorphous phase |
| Example 327 | brass | wristwatch band | 60 | 30 | | 10 | | 740 | 0.1 | 600 | no | acceptable | amorphous phase |
| Example 328 | brass | wristwatch bezel | 45 | 50 | | 5 | | 810 | 0.2 | 650 | no | acceptable | amorphous phase |
| Example 329 | brass | wristwatch case back | 50 | 45 | | 5 | | 800 | 0.2 | 650 | no | acceptable | amorphous phase |
| Example 330 | SUS316L | wristwatch band | 60 | 35 | | 5 | | 770 | 0.15 | 650 | no | acceptable | amorphous phase |
| Example 331 | SUS316L | wristwatch bezel | 70 | 25 | | 5 | | 680 | 0.1 | 550 | no | acceptable | amorphous phase |
| Example 332 | SUS316L | wristwatch case back | 45 | 54 | | 1 | | 820 | 0.2 | 700 | no | acceptable | amorphous phase |
| Example 333 | SUS316L | wristwatch case | 70 | 29 | | 1 | | 670 | 0.1 | 550 | no | acceptable | amorphous phase |
| Example 334 | Ti | wristwatch band | 45 | 30 | | | 25 | 700 | 0.1 | 600 | no | acceptable | amorphous phase |
| Example 335 | Ti | wristwatch bezel | 50 | 25 | | | 25 | 670 | 0.1 | 550 | no | acceptable | amorphous phase |
| Example 336 | Ti | wristwatch case back | 45 | 35 | | | 20 | 730 | 0.1 | 600 | no | acceptable | amorphous phase |
| Example 337 | Ti | wristwatch case | 55 | 25 | | | 20 | 660 | 0.1 | 550 | no | acceptable | amorphous phase |
| Example 338 | SUS304 | wristwatch band | 45 | 40 | | | 15 | 750 | 0.15 | 600 | no | acceptable | amorphous phase |
| Example 339 | SUS304 | wristwatch bezel | 55 | 30 | | | 15 | 710 | 0.1 | 600 | no | acceptable | amorphous phase |
| Example 340 | SUS304 | wristwatch case back | 45 | 45 | | | 10 | 770 | 0.15 | 650 | no | acceptable | amorphous phase |
| Example 341 | SUS304 | wristwatch case | 55 | 35 | | | 10 | 720 | 0.1 | 600 | no | acceptable | amorphous phase |
| Example 342 | brass | wristwatch band | 60 | 30 | | | 10 | 700 | 0.1 | 600 | no | acceptable | amorphous phase |
| Example 343 | brass | wristwatch bezel | 45 | 50 | | | 5 | 780 | 0.15 | 650 | no | acceptable | amorphous phase |
| Example 344 | brass | wristwatch case back | 50 | 45 | | | 5 | 750 | 0.15 | 600 | no | acceptable | amorphous phase |
| Example 345 | SUS316L | wristwatch band | 60 | 35 | | | 5 | 730 | 0.1 | 600 | no | acceptable | amorphous phase |
| Example 346 | SUS316L | wristwatch bezel | 70 | 25 | | | 5 | 640 | 0.1 | 500 | no | acceptable | amorphous phase |
| Example 347 | SUS316L | wristwatch case back | 45 | 54 | | | 1 | 770 | 0.15 | 650 | no | acceptable | amorphous phase |
| Example 348 | SUS316L | wristwatch case | 70 | 29 | | | 1 | 630 | 0.1 | 500 | no | acceptable | amorphous phase |

TABLE 6

| | Material of soft metal | Soft metal article Decorative article of wristwatch | Intermediate hard layer | Composition of hard layer (wt %) | | Hardness (Hv) | Surface roughness Average surface roughness Ra (μm) | Adhesion property Peeling starting load (gf) | Corrosion resistance Corrosion | Overall evaluation |
|---|---|---|---|---|---|---|---|---|---|---|
| | | | | Zr | Mo | | | | | |
| Example 67 | Ti | wristwatch bezel | Co—Zr alloy | 25 | 75 | 940 | 0.35 | 750 | no | acceptable |
| Example 68 | Ti | wristwatch band | Co—Zr alloy | 30 | 70 | 940 | 0.35 | 750 | no | acceptable |
| Example 69 | Ti | wristwatch case | Co—Zr alloy | 40 | 60 | 820 | 0.2 | 700 | no | acceptable |
| Example 70 | brass | flat plate | Co—Zr alloy | 50 | 50 | 700 | 0.1 | 600 | no | acceptable |
| Example 71 | brass | wristwatch band | Co—Zr alloy | 60 | 40 | 660 | 0.1 | 550 | no | acceptable |
| Example 72 | brass | wristwatch case | Co—Zr alloy | 70 | 30 | 630 | 0.1 | 500 | no | acceptable |
| Example 73 | Al | flat plate | Co—Zr alloy | 25 | 75 | 890 | 0.25 | 750 | no | acceptable |
| Example 74 | Al | wristwatch case | Co—Zr alloy | 30 | 70 | 880 | 0.25 | 700 | no | acceptable |
| Example 75 | Al | wristwatch case | Co—Zr alloy | 40 | 60 | 760 | 0.15 | 650 | no | acceptable |

TABLE 6-continued

| | Material of soft metal | Soft metal article Decorative article of wristwatch | Intermediate hard layer | Composition of hard layer (wt %) Zr | Composition of hard layer (wt %) Mo | Hardness (Hv) | Surface roughness Average surface roughness Ra (μm) | Adhesion property Peeling starting load (gf) | Corrosion resistance Corrosion | Overall evaluation |
|---|---|---|---|---|---|---|---|---|---|---|
| Example 76 | Al | flat plate | Co—Nb—Zr alloy | 50 | 50 | 690 | 0.1 | 550 | no | acceptable |
| Example 77 | Al | wristwatch case | Co—Nb—Zr alloy | 60 | 40 | 760 | 0.15 | 650 | no | acceptable |
| Example 78 | Al | wristwatch case | Co—Nb—Zr alloy | 70 | 30 | 620 | 0.1 | 500 | no | acceptable |
| Example 79 | brass | flat plate | Co—Nb—Zr alloy | 25 | 75 | 930 | 0.3 | 750 | no | acceptable |
| Example 80 | brass | wristwatch band | Co—Nb—Zr alloy | 30 | 70 | 900 | 0.3 | 750 | no | acceptable |
| Example 81 | brass | wristwatch case | Co—Nb—Zr alloy | 40 | 60 | 780 | 0.15 | 650 | no | acceptable |
| Example 82 | Ti | wristwatch bezel | Co—Nb—Zr alloy | 50 | 50 | 750 | 0.15 | 600 | no | acceptable |
| Example 83 | Ti | wristwatch band | Co—Nb—Zr alloy | 60 | 40 | 690 | 0.1 | 550 | no | acceptable |
| Example 84 | Ti | wristwatch case | Co—Nb—Zr alloy | 70 | 30 | 680 | 0.1 | 550 | no | acceptable |

TABLE 7

| | Material of soft metal | Soft metal article Decorative article of wristwatch | Intermediate hard layer | Composition of hard layer (wt %) Zr | Mo | Nb | Ta | Ti | Hardness (Hv) | Surface roughness Average surface roughness Ra (μm) | Adhesion property Peeling starting load (gf) | Corrosion resistance Corrosion | Overall evaluation |
|---|---|---|---|---|---|---|---|---|---|---|---|---|---|
| Example 85 | Al | flat plate | Co—Zr alloy | 30 | 60 | 10 | | | 960 | 0.35 | 800 | no | acceptable |
| Example 86 | Al | wristwatch case | Co—Zr alloy | 45 | 50 | 5 | | | 820 | 0.2 | 700 | no | acceptable |
| Example 87 | brass | wristwatch case | Co—Zr alloy | 45 | 45 | 10 | | | 800 | 0.2 | 650 | no | acceptable |
| Example 88 | Ti | wristwatch case | Co—Zr alloy | 40 | 40 | 20 | | | 810 | 0.2 | 650 | no | acceptable |
| Example 89 | SUS304 | wristwatch case | Co—Zr alloy | 50 | 40 | 10 | | | 820 | 0.2 | 700 | no | acceptable |
| Example 90 | SUS316L | wristwatch case | Co—Zr alloy | 50 | 30 | 20 | | | 750 | 0.15 | 600 | no | acceptable |
| Example 91 | brass | flat plate | Co—Zr alloy | 30 | 60 | | 10 | | 980 | 0.35 | 800 | no | acceptable |
| Example 92 | Al | wristwatch case | Co—Zr alloy | 45 | 50 | | 5 | | 790 | 0.15 | 650 | no | acceptable |
| Example 93 | brass | wristwatch band | Co—Zr alloy | 45 | 45 | | 10 | | 780 | 0.15 | 650 | no | acceptable |
| Example 94 | Ti | wristwatch bezel | Co—Zr alloy | 40 | 40 | | 20 | | 810 | 0.2 | 650 | no | acceptable |
| Example 95 | SUS304 | wristwatch bezel | Co—Zr alloy | 50 | 40 | | 10 | | 820 | 0.2 | 700 | no | acceptable |
| Example 96 | SUS316L | wristwatch bezel | Co—Zr alloy | 50 | 30 | | 20 | | 750 | 0.15 | 600 | no | acceptable |
| Example 97 | Al | flat plate | Co—Zr alloy | 30 | 60 | | | 10 | 930 | 0.3 | 750 | no | acceptable |
| Example 98 | Al | wristwatch case | Co—Zr alloy | 45 | 50 | | | 5 | 800 | 0.2 | 650 | no | acceptable |
| Example 99 | Ti | clasp | Co—Zr alloy | 45 | 45 | | | 10 | 780 | 0.15 | 650 | no | acceptable |
| Example 100 | Ti | wristwatch case back | Co—Zr alloy | 40 | 40 | | | 20 | 800 | 0.2 | 650 | no | acceptable |
| Example 101 | SUS304 | wristwatch case back | Co—Zr alloy | 50 | 40 | | | 10 | 820 | 0.2 | 700 | no | acceptable |
| Example 102 | SUS316L | wristwatch case back | Co—Zr alloy | 50 | 30 | | | 20 | 760 | 0.15 | 650 | no | acceptable |
| Example 103 | brass | wristwatch band | Co—Zr alloy | 30 | 60 | 5 | 5 | | 990 | 0.4 | 800 | no | acceptable |
| Example 104 | brass | flat plate | Co—Zr alloy | 40 | 50 | 5 | 5 | | 820 | 0.2 | 700 | no | acceptable |
| Example 105 | Ti | wristwatch band | Co—Zr alloy | 35 | 50 | 10 | 5 | | 800 | 0.2 | 650 | no | acceptable |
| Example 106 | Al | wristwatch case | Co—Zr alloy | 45 | 40 | 10 | 5 | | 740 | 0.1 | 600 | no | acceptable |
| Example 107 | Ti | wristwatch band | Co—Zr alloy | 30 | 60 | 5 | | 5 | 960 | 0.35 | 800 | no | acceptable |
| Example 108 | Al | flat plate | Co—Zr alloy | 40 | 50 | 5 | | 5 | 820 | 0.2 | 700 | no | acceptable |
| Example 109 | SUS304 | wristwatch band | Co—Zr alloy | 35 | 50 | 10 | | 5 | 810 | 0.2 | 700 | no | acceptable |
| Example 110 | brass | wristwatch case | Co—Zr alloy | 45 | 40 | 10 | | 5 | 740 | 0.1 | 600 | no | acceptable |
| Example 111 | Ti | wristwatch band | Co—Zr alloy | 30 | 60 | | 5 | 5 | 950 | 0.35 | 750 | no | acceptable |
| Example 112 | Ti | flat plate | Co—Zr alloy | 40 | 50 | | 5 | 5 | 820 | 0.2 | 700 | no | acceptable |
| Example 113 | SUS304 | wristwatch case back | Co—Zr alloy | 35 | 50 | | 10 | 5 | 830 | 0.2 | 700 | no | acceptable |
| Example 114 | SUS304 | wristwatch case back | Co—Zr alloy | 45 | 40 | | 10 | 5 | 750 | 0.15 | 600 | no | acceptable |
| Example 115 | SUS316L | wristwatch band | Co—Zr alloy | 40 | 40 | 10 | 5 | 5 | 790 | 0.15 | 650 | no | acceptable |
| Example 116 | SUS316L | wristwatch case | Co—Zr alloy | 40 | 40 | 5 | 10 | 5 | 760 | 0.15 | 650 | no | acceptable |
| Example 117 | SUS316L | wristwatch case back | Co—Zr alloy | 40 | 40 | 5 | 5 | 10 | 770 | 0.15 | 650 | no | acceptable |

TABLE 7-continued

| | Material of soft metal | Soft metal article Decorative article of wristwatch | Intermediate hard layer | Composition of hard layer (wt %) | | | | | Hardness (Hv) | Surface roughness Average surface roughness Ra (μm) | Adhesion property Peeling starting load (gf) | Corrosion resistance Corrosion | Overall evaluation |
|---|---|---|---|---|---|---|---|---|---|---|---|---|---|
| | | | | Zr | Mo | Nb | Ta | Ti | | | | | |
| Example 118 | Al | flat plate | Co—Nb—Zr alloy | 30 | 60 | 10 | | | 950 | 0.35 | 750 | no | acceptable |
| Example 119 | Al | wristwatch case | Co—Nb—Zr alloy | 45 | 50 | 5 | | | 830 | 0.2 | 700 | no | acceptable |
| Example 120 | brass | wristwatch band | Co—Nb—Zr alloy | 45 | 45 | 10 | | | 790 | 0.15 | 650 | no | acceptable |

TABLE 8

| | Material of soft metal | Soft metal article Decorative article of wristwatch | Intermediate hard layer | Composition of hard layer (wt %) | | | | | Hardness (Hv) | Surface roughness Average surface roughness Ra (μm) | Adhesion property Peeling starting load (gf) | Corrosion resistance Corrosion | Overall evaluation |
|---|---|---|---|---|---|---|---|---|---|---|---|---|---|
| | | | | Zr | Mo | Nb | Ta | Ti | | | | | |
| Example 121 | Ti | wristwatch band | Co—Nb—Zr alloy | 40 | 40 | 20 | | | 820 | 0.2 | 700 | no | acceptable |
| Example 122 | brass | flat plate | Co—Nb—Zr alloy | 50 | 40 | 10 | | | 830 | 0.2 | 700 | no | acceptable |
| Example 123 | brass | wristwatch band | Co—Nb—Zr alloy | 50 | 30 | 20 | | | 750 | 0.15 | 600 | no | acceptable |
| Example 124 | Ti | wristwatch case | Co—Nb—Zr alloy | 30 | 60 | | 10 | | 960 | 0.35 | 800 | no | acceptable |
| Example 125 | SUS304 | wristwatch case | Co—Nb—Zr alloy | 45 | 50 | | 5 | | 770 | 0.15 | 650 | no | acceptable |
| Example 126 | SUS316L | wristwatch case | Co—Nb—Zr alloy | 45 | 45 | | 10 | | 770 | 0.15 | 650 | no | acceptable |
| Example 127 | Al | flat plate | Co—Nb—Zr alloy | 40 | 40 | | 20 | | 790 | 0.15 | 650 | no | acceptable |
| Example 128 | Al | wristwatch case | Co—Nb—Zr alloy | 50 | 40 | | 10 | | 810 | 0.2 | 650 | no | acceptable |
| Example 129 | brass | wristwatch band | Co—Nb—Zr alloy | 50 | 30 | | 20 | | 740 | 0.1 | 600 | no | acceptable |
| Example 130 | Ti | wristwatch bezel | Co—Nb—Zr alloy | 30 | 60 | | | 10 | 940 | 0.35 | 750 | no | acceptable |
| Example 131 | SUS304 | wristwatch bezel | Co—Nb—Zr alloy | 45 | 50 | | | 5 | 820 | 0.2 | 700 | no | acceptable |
| Example 132 | SUS316L | wristwatch bezel | Co—Nb—Zr alloy | 45 | 45 | | | 10 | 790 | 0.15 | 650 | no | acceptable |
| Example 133 | brass | wristwatch case | Co—Nb—Zr alloy | 40 | 40 | | | 20 | 810 | 0.2 | 650 | no | acceptable |
| Example 134 | brass | wristwatch band | Co—Nb—Zr alloy | 50 | 40 | | | 10 | 810 | 0.2 | 650 | no | acceptable |
| Example 135 | Ti | clasp | Co—Nb—Zr alloy | 50 | 30 | | | 20 | 770 | 0.15 | 650 | no | acceptable |
| Example 136 | Ti | wristwatch case back | Co—Nb—Zr alloy | 30 | 60 | 5 | 5 | | 1000 | 0.4 | 800 | no | acceptable |
| Example 137 | SUS304 | clasp | Co—Nb—Zr alloy | 40 | 50 | 5 | 5 | | 830 | 0.2 | 700 | no | acceptable |
| Example 138 | SUS316L | clasp | Co—Nb—Zr alloy | 35 | 50 | 10 | 5 | | 820 | 0.2 | 700 | no | acceptable |
| Example 139 | SUS304 | wristwatch case back | Co—Nb—Zr alloy | 45 | 40 | 10 | 5 | | 760 | 0.15 | 650 | no | acceptable |
| Example 140 | SUS304 | wristwatch case | Co—Nb—Zr alloy | 30 | 60 | 5 | | 5 | 980 | 0.35 | 800 | no | acceptable |
| Example 141 | SUS304 | wristwatch band | Co—Nb—Zr alloy | 40 | 50 | 5 | | 5 | 840 | 0.2 | 700 | no | acceptable |
| Example 142 | Ti | wristwatch case | Co—Nb—Zr alloy | 35 | 50 | 10 | | 5 | 820 | 0.2 | 700 | no | acceptable |
| Example 143 | Ti | wristwatch band | Co—Nb—Zr alloy | 45 | 40 | 10 | | 5 | 770 | 0.15 | 650 | no | acceptable |
| Example 144 | SUS316L | wristwatch case back | Co—Nb—Zr alloy | 30 | 60 | | 5 | 5 | 960 | 0.35 | 800 | no | acceptable |
| Example 145 | SUS316L | wristwatch case | Co—Nb—Zr alloy | 40 | 50 | | 5 | 5 | 840 | 0.2 | 700 | no | acceptable |

TABLE 8-continued

| | Material of soft metal | Soft metal article Decorative article of wristwatch | Composition of Intermediate hard layer | Composition of hard layer (wt %) | | | | | Hardness (Hv) | Surface roughness Average surface roughness Ra (μm) | Adhesion property Peeling starting load (gf) | Corrosion resistance Corrosion | Overall evaluation |
|---|---|---|---|---|---|---|---|---|---|---|---|---|---|
| | | | | Zr | Mo | Nb | Ta | Ti | | | | | |
| Example 146 | SUS316L | wristwatch band | Co—Nb—Zr alloy | 35 | 50 | | 10 | 5 | 840 | 0.2 | 700 | no | acceptable |
| Example 147 | Ti | clasp | Co—Nb—Zr alloy | 45 | 40 | | 10 | 5 | 770 | 0.15 | 650 | no | acceptable |
| Example 148 | Ti | wristwatch case back | Co—Nb—Zr alloy | 40 | 40 | 10 | 5 | 5 | 810 | 0.2 | 650 | no | acceptable |
| Example 149 | brass | wristwatch case | Co—Nb—Zr alloy | 40 | 40 | 5 | 10 | 5 | 760 | 0.15 | 650 | no | acceptable |
| Example 150 | brass | wristwatch band | Co—Nb—Zr alloy | 40 | 40 | 5 | 5 | 10 | 780 | 0.15 | 650 | no | acceptable |

TABLE 9

| | Composition of hard layer (wt %) | | | | | Thickness of hard layer (μm) | Decrease in the reception sensitivity (dB) (less than −1 dB is acceptable) | Abrasion resistance 2 kgf 30 times of reciprocations | Evaluation result | Hardness | Quality of external appearance |
|---|---|---|---|---|---|---|---|---|---|---|---|
| | Zr | Mo | Nb | Ta | Ti | | | | | | |
| Example 401 | 20 | 80 | | | | 1 | −0.1 | ○ | acceptable | 1150 | surface roughness |
| Example 402 | 25 | 75 | | | | 1 | −0.1 | ○ | acceptable | 950 | good |
| Example 403 | 30 | 70 | | | | 1 | −0.1 | ○ | acceptable | 930 | good |
| Example 404 | 40 | 60 | | | | 1 | −0.1 | ○ | acceptable | 800 | good |
| Example 405 | 50 | 50 | | | | 1 | −0.1 | ○ | acceptable | 730 | good |
| Example 406 | 60 | 40 | | | | 1 | −0.1 | ○ | acceptable | 680 | good |
| Example 407 | 70 | 30 | | | | 1 | −0.1 | ○ | acceptable | 650 | good |
| Example 408 | 75 | 25 | | | | 1 | −0.1 | ○ | acceptable | 550 | good |
| Example 409 | 20 | 54 | 26 | | | 1 | −0.1 | ○ | acceptable | 1040 | surface roughness |
| Example 410 | 15 | 70 | 15 | | | 1 | −0.1 | ○ | acceptable | 1100 | surface roughness |
| Example 411 | 20 | 65 | 15 | | | 1 | −0.1 | ○ | acceptable | 900 | good |
| Example 412 | 25 | 60 | 15 | | | 1 | −0.1 | ○ | acceptable | 920 | good |
| Example 413 | 45 | 50 | 5 | | | 1 | −0.1 | ○ | acceptable | 740 | good |
| Example 414 | 40 | 50 | 10 | | | 1 | −0.1 | ○ | acceptable | 770 | good |
| Example 415 | 50 | 49 | 1 | | | 1 | −0.1 | ○ | acceptable | 730 | good |
| Example 416 | 50 | 47 | 3 | | | 1 | −0.1 | ○ | acceptable | 720 | good |
| Example 417 | 55 | 40 | 5 | | | 1 | −0.1 | ○ | acceptable | 700 | good |
| Example 418 | 50 | 40 | 10 | | | 1 | −0.1 | ○ | acceptable | 740 | good |
| Example 419 | 40 | 40 | 20 | | | 1 | −0.1 | ○ | acceptable | 730 | good |
| Example 420 | 50 | 30 | 20 | | | 1 | −0.1 | ○ | acceptable | 660 | good |
| Example 421 | 70 | 25 | 5 | | | 1 | −0.1 | ○ | acceptable | 640 | good |
| Example 422 | 50 | 25 | 25 | | | 1 | −0.1 | ○ | acceptable | 670 | good |
| Example 423 | 75 | 20 | 5 | | | 1 | −0.1 | ○ | acceptable | 520 | good |
| Example 424 | 20 | 54 | | 26 | | 1 | −0.1 | ○ | acceptable | 1050 | surface roughness |
| Example 425 | 15 | 70 | | 15 | | 1 | −0.1 | ○ | acceptable | 1100 | surface roughness |
| Example 426 | 20 | 65 | | 15 | | 1 | −0.1 | ○ | acceptable | 940 | good |
| Example 427 | 45 | 50 | | 5 | | 1 | −0.1 | ○ | acceptable | 800 | good |
| Example 428 | 50 | 49 | | 1 | | 1 | −0.1 | ○ | acceptable | 720 | good |
| Example 429 | 55 | 40 | | 5 | | 1 | −0.1 | ○ | acceptable | 710 | good |
| Example 430 | 40 | 40 | | 20 | | 1 | −0.1 | ○ | acceptable | 740 | good |
| Example 431 | 70 | 25 | | 5 | | 1 | −0.1 | ○ | acceptable | 630 | good |
| Example 432 | 75 | 20 | | 5 | | 1 | −0.1 | ○ | acceptable | 520 | good |
| Example 433 | 20 | 54 | | | 26 | 1 | −0.1 | ○ | acceptable | 1040 | surface roughness |
| Example 434 | 15 | 70 | | | 15 | 1 | −0.1 | ○ | acceptable | 1100 | surface roughness |
| Example 435 | 25 | 60 | | | 15 | 1 | −0.1 | ○ | acceptable | 920 | good |
| Example 436 | 40 | 50 | | | 10 | 1 | −0.1 | ○ | acceptable | 750 | good |
| Example 437 | 50 | 47 | | | 3 | 1 | −0.1 | ○ | acceptable | 710 | good |
| Example 438 | 50 | 40 | | | 10 | 1 | −0.1 | ○ | acceptable | 790 | good |
| Example 439 | 50 | 30 | | | 20 | 1 | −0.1 | ○ | acceptable | 650 | good |
| Example 440 | 50 | 25 | | | 25 | 1 | −0.1 | ○ | acceptable | 630 | good |
| Example 441 | 75 | 20 | | | 5 | 1 | −0.1 | ○ | acceptable | 520 | good |

TABLE 10

| | Composition of hard layer (wt %) | | | | | Thickness of hard layer (μm) | Decrease in the reception sensitivity (dB) (less than −1 dB is acceptable) | Abrasion resistance 2 kgf 30 times of reciprocations | Evaluation result | Hardness | Quality of external appearance |
|---|---|---|---|---|---|---|---|---|---|---|---|
| | Zr | Mo | Nb | Ta | Ti | | | | | | |
| Example 442 | 25 | 60 | 10 | 5 | | 1 | −0.1 | ○ | acceptable | 920 | good |
| Example 443 | 50 | 40 | 5 | 5 | | 1 | −0.1 | ○ | acceptable | 690 | good |
| Example 444 | 45 | 50 | 2 | | 3 | 1 | −0.1 | ○ | acceptable | 800 | good |
| Example 445 | 40 | 50 | 5 | | 5 | 1 | −0.1 | ○ | acceptable | 780 | good |
| Example 446 | 40 | 50 | | 5 | 5 | 1 | −0.1 | ○ | acceptable | 770 | good |
| Example 447 | 40 | 40 | | 10 | 10 | 1 | −0.1 | ○ | acceptable | 750 | good |
| Example 448 | 15 | 70 | 5 | 5 | 5 | 1 | −0.1 | ○ | acceptable | 1120 | surface roughness |
| Example 449 | 50 | 47 | 1 | 1 | 1 | 1 | −0.1 | ○ | acceptable | 740 | good |
| Example 450 | 40 | 40 | 10 | 5 | 5 | 1 | −0.1 | ○ | acceptable | 700 | good |
| Example 451 | 40 | 40 | 5 | 10 | 5 | 1 | −0.1 | ○ | acceptable | 680 | good |
| Example 452 | 40 | 40 | 5 | 5 | 10 | 1 | −0.1 | ○ | acceptable | 680 | good |
| Example 453 | 80 | 5 | 5 | 5 | 5 | 1 | −0.1 | ○ | acceptable | 500 | good |

TABLE 11

| | Composition of metal film (wt %) | | | | | | | Thickness of metal film (μm) | Decrease in the reception sensitivity (dB) (less than −1 dB is acceptable) | Abrasion resistance 2 kgf 30 times of reciprocations | Evaluation result | Hardness |
|---|---|---|---|---|---|---|---|---|---|---|---|---|
| | Au | Ni | P | Fe | Cr | Pt | Al | | | | | |
| C/P ex. 401 | 100 | | | | | | | 1 | −5.1 | ○ | unacceptable | 250 |
| C/P ex. 402 | | 8 | | 74 | 18 | | | 1 | −2.5 | ○ | unacceptable | 160 |
| C/P ex. 403 | | | | 82 | 18 | | | 1 | −4.5 | ○ | unacceptable | 180 |
| C/P ex. 404 | | | | | | 100 | | 1 | −1.3 | ○ | unacceptable | 200 |
| C/P ex. 405 | | 92 | 8 | | | | | 1 | −5.2 | X | unacceptable | 500 |
| C/P ex. 406 | | | | | | | 100 | 1 | −1.5 | X | unacceptable | 200 |

*C/P ex. = comparative example

TABLE 12

| | Composition of hard layer and metal film (wt %) | | | | | Thickness of hard layer or metal film (μm) | Decrease in the reception sensitivity (dB) (less than −1 dB is acceptable) | Abrasion resistance 2 kgf 30 times of reciprocations | Evaluation result | Hardness | Quality of external appearance |
|---|---|---|---|---|---|---|---|---|---|---|---|
| | Zr | Mo | Nb | Au | Ni | | | | | | |
| Example 454 | 60 | 40 | | | | 0.3 | −0.1 | ○ | acceptable | 680 | good |
| Example 455 | 60 | 40 | | | | 0.6 | −0.1 | ○ | acceptable | 680 | good |
| Example 456 | 60 | 40 | | | | 0.9 | −0.1 | ○ | acceptable | 680 | good |
| Example 457 | 60 | 40 | | | | 1.2 | −0.1 | ○ | acceptable | 680 | good |
| Example 458 | 50 | 40 | 10 | | | 0.3 | −0.1 | ○ | acceptable | 740 | good |
| Example 459 | 50 | 40 | 10 | | | 0.6 | −0.1 | ○ | acceptable | 740 | good |
| Example 460 | 50 | 40 | 10 | | | 0.9 | −0.1 | ○ | acceptable | 740 | good |
| Example 461 | 50 | 40 | 10 | | | 1.2 | −0.1 | ○ | acceptable | 740 | good |
| C/P ex. 407 | | | | 100 | | 0.3 | −2.1 | X | unacceptable | 250 | good |
| C/P ex. 408 | | | | 100 | | 0.6 | −3.5 | ○ | unacceptable | 250 | good |
| C/P ex. 409 | | | | 100 | | 0.9 | −5.1 | ○ | unacceptable | 250 | good |
| C/P ex. 410 | | | | 100 | | 1.2 | −6.5 | ○ | unacceptable | 250 | good |
| C/P ex. 411 | | | | | 100 | 0.3 | −2.5 | X | unacceptable | 500 | good |
| C/P ex. 412 | | | | | 100 | 0.6 | −3.8 | ○ | unacceptable | 500 | good |
| C/P ex. 413 | | | | | 100 | 0.9 | −5.2 | ○ | unacceptable | 500 | good |
| C/P ex. 414 | | | | | 100 | 1.2 | −6.8 | ○ | unacceptable | 500 | good |

*C/P ex. = comparative example

TABLE 13

| | Hard layer | | | Protective film | | Decrease in the reception | Abrasion resistance | | |
|---|---|---|---|---|---|---|---|---|---|
| | Composition (wt %) | | | Film thickness | | Film thickness | sensitivity (dB) (less than −1 dB | 2 kgf 30 times of | Quality of external | Evaluation |
| | Zr | Mo | Nb | (μm) | Material | (μm) | is acceptable) | reciprocations | appearance | result |
| Example 462 | 50 | 40 | 10 | 0.1 | acryl | 25 | −0.05 | ○ | good | acceptable |
| Example 463 | 50 | 40 | 10 | 0.1 | urethane | 20 | −0.05 | ○ | good | acceptable |
| Example 464 | 50 | 40 | 10 | 0.1 | silicone | 10 | −0.05 | ○ | good | acceptable |
| C/P ex. 415 | 50 | 40 | 10 | 0.1 | acryl | 3 | −0.05 | X | good | unacceptable |
| C/P ex. 416 | 50 | 40 | 10 | 0.1 | acryl | 40 | −0.05 | ○ | not good | unacceptable |
| C/P ex. 417 | 50 | 40 | 10 | 0.03 | urethane | 20 | −0.02 | ○ | not good | unacceptable |

*C/P ex. = comparative example

INDUSTRIAL APPLICABILITY

According to the invention, a soft metal and a decorative article of wristwatch can be obtained that are high in abrasion resistance, insusceptible to scratches, and excellent in corrosion resistance because of a high hardness of the surface. The soft metal and decorative article of wristwatch according to the invention are excellent in corrosion resistance and thus hardly to cause corrosion, providing a high-class feeling to the decorativeness of the external appearance. Especially when a hard layer to be formed on the surface is in the amorphous phase, the hard layer becomes a smooth film, whereby even if touched with a finger, the surface is insusceptible to a fingerprint left thereon, so that the decorativeness of the external appearance can be further improved to provide a high-class feeling.

Further, a decorative article of wristwatch formed of an insulating decorative base material with a hard layer formed thereon is not only high in abrasion resistance, insusceptible to scratches, and excellent in corrosion resistance, but also has no influence on the radio wave reception sensitivity of an antenna even when the hard layer is formed thereon, and is therefore suitable for a decorative article of wristwatch for a radio-controlled wristwatch.

The invention claimed is:

1. A soft metal article, comprising:
a substrate made of soft metal; and
a hard layer formed on a surface of said substrate, said hard layer containing
about 30 to 75 wt % of molybdenum, and
the balance essentially of zirconium,
wherein said hard layer is formed through an intermediate hard layer made of an alloy containing at least one selected from iron, cobalt, and nickel.

2. The soft metal article according to claim 1, wherein a content of molybdenum constituting said hard layer is about 30 to 60 wt %.

3. A soft metal article, comprising:
a substrate made of soft metal; and
a hard layer formed on a surface of said substrate, said hard layer containing
about 25 to 65 wt % of molybdenum,
about 25 wt % or less of an additive element constituted of one or more selected from niobium, tantalum, and titanium, and
the balance essentially of zirconium,
wherein said hard layer is formed through an intermediate hard layer made of an alloy containing at least one selected from iron, cobalt, and nickel.

4. The soft metal article according to claim 3, wherein a total content of molybdenum and additive elements constituting said hard layer is about 30 to 80 wt %.

5. The soft metal article according to claim 3, wherein a total content of molybdenum and additive elements constituting said hard layer is about 30 to 55 wt %.

6. A decorative article, comprising:
a substrate made of soft metal; and
a hard layer formed on a surface of said substrate, said hard layer containing
about 30 to 75 wt % of molybdenum, and
the balance essentially of zirconium,
wherein said decorative article is a decorative article of wristwatch, and
wherein said hard layer is formed through an intermediate hard layer made of an alloy containing at least one selected from iron, cobalt, and nickel.

7. The decorative article of wristwatch according to claim 6, wherein a content of molybdenum constituting said hard layer is about 30 to 60 wt %.

8. A decorative article, comprising:
a substrate made of soft metal; and
a hard layer formed on a surface of said substrate, said hard layer containing
about 25 to 65 wt % of molybdenum,
about 25 wt % or less of an additive element constituted of at least one or more selected from niobium, tantalum, and titanium, and
the balance essentially of zirconium,
wherein said decorative article is a decorative article of wristwatch, and
wherein said hard layer is formed through an intermediate hard layer made of an alloy containing at least one selected from iron, cobalt, and nickel.

9. The decorative article of wristwatch according to claim 8, wherein a total content of molybdenum and additive elements constituting said hard layer is about 30 to 80 wt %.

10. The decorative article of wristwatch according to claim 8, wherein a total content of molybdenum and additive elements constituting said hard layer is about 30 to 55 wt %.

* * * * *